United States Patent
Kimura

(10) Patent No.: US 11,437,109 B2
(45) Date of Patent: Sep. 6, 2022

(54) SEMICONDUCTOR STORAGE DEVICE

(71) Applicant: KIOXIA CORPORATION, Tokyo (JP)

(72) Inventor: Keita Kimura, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 2 days.

(21) Appl. No.: 17/188,687

(22) Filed: Mar. 1, 2021

(65) Prior Publication Data

US 2022/0020440 A1 Jan. 20, 2022

(30) Foreign Application Priority Data

Jul. 14, 2020 (JP) .............................. JP2020-120351

(51) Int. Cl.
| | | |
|---|---|---|
| *G11C 16/34* | (2006.01) | |
| *G11C 16/04* | (2006.01) | |
| *G11C 16/26* | (2006.01) | |
| *H01L 27/11556* | (2017.01) | |
| *G11C 5/02* | (2006.01) | |

(52) U.S. Cl.
CPC .......... *G11C 16/3436* (2013.01); *G11C 5/025* (2013.01); *G11C 16/0408* (2013.01); *G11C 16/26* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 9,666,296 B1 | 5/2017 | Maejima | |
| 9,761,318 B1* | 9/2017 | Kondo | ............... G11C 16/3454 |
| 10,381,094 B2 | 8/2019 | Wu et al. | |
| 2012/0106246 A1 | 5/2012 | Nawata | |
| 2020/0273530 A1* | 8/2020 | Shimura | ................ G11C 16/08 |

FOREIGN PATENT DOCUMENTS

| | | |
|---|---|---|
| JP | 2017-157260 A | 9/2017 |
| JP | 2017-162534 A | 9/2017 |

* cited by examiner

*Primary Examiner* — James G Norman
(74) *Attorney, Agent, or Firm* — Kim & Stewart LLP

(57) ABSTRACT

A semiconductor storage device includes memory strings, bit lines connected to the memory strings, respectively, sense transistors of which gates are connected to the bit lines, respectively, first transistors connected between the bit lines and the gates of the sense transistors, respectively, and a control circuit. Each of the memory strings includes first and second memory transistors adjacent to each other. The control circuit is configured to perform, during a first write sequence, a read operation with respect to the second memory transistors, a program operation with respect to the first memory transistors, and a verify operation with respect to the first memory transistors, in this order. During the verify operation, the control circuit turns on the first transistors during a first sense period, and then turns on the first transistors during a second sense period longer than the first sense period.

20 Claims, 32 Drawing Sheets

FIG. 18

| | |
|---|---|
| PG$m_P$ | $m_P$+1 |
| PG$m_P$−1 | $m_P$ |
| ⋮ | ⋮ |
| PG$n_P$+1 | $n_P$+2 |
| PG$n_P$ | $n_P$+1 |
| PG$n_P$−1 | $n_P$ |
| ⋮ | ⋮ |
| PG2 | 3 |
| PG1 | 2 |
| PG0 | 1 |

FIG. 22

|  | Foggy | Fine |
|---|---|---|
| PG$m_P$ | $2m_P$ | $2m_P+2$ |
| PG$m_P$-1 | $2m_P-2$ | $2m_P+1$ |
| ⋮ | ⋮ | ⋮ |
| PG$n_P$+1 | $2n_P+2$ | $2n_P+5$ |
| PG$n_P$ | $2n_P$ | $2n_P+3$ |
| PG$n_P$-1 | $2n_P-2$ | $2n_P+1$ |
| ⋮ | ⋮ | ⋮ |
| PG2 | 4 | 7 |
| PG1 | 2 | 5 |
| PG0 | 1 | 3 |

SEMICONDUCTOR STORAGE DEVICE

CROSS-REFERENCE TO RELATED APPLICATION(S)

This application is based upon and claims the benefit of priority from Japanese Patent Application No. 2020-120351, filed on Jul. 14, 2020, the entire contents of which are incorporated herein by reference.

FIELD

Embodiments described herein relate generally to a semiconductor storage device.

BACKGROUND

A semiconductor storage device having a memory string including a plurality of memory transistors is known.

BRIEF DESCRIPTION OF THE DRAWINGS

FIG. 18 is a schematic diagram illustrating a sequence of writing in a full sequence write.

FIG. 22 is a schematic diagram illustrating a sequence of writing in a foggy fine write.

DETAILED DESCRIPTION

Figure 1:
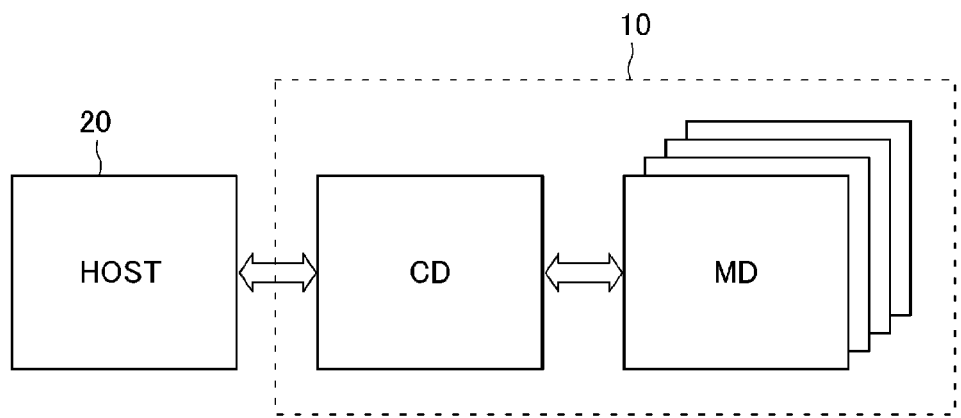
FIG. 1 is a schematic block diagram illustrating the configuration of a memory system according to a first embodiment.

Embodiments provide a semiconductor storage device with high reliability.

In general, according to an embodiment, a semiconductor storage device includes a plurality of memory strings, a plurality of bit lines connected to the memory strings, respectively, a plurality of sense transistors of which gates are connected to the bit lines, respectively, a plurality of first transistors connected between the bit lines and the gates of the sense transistors, respectively, and a control circuit. Each of the memory strings includes first and second memory transistors adjacent to each other. The control circuit is configured to perform, during a first write sequence, a read operation with respect to the second memory transistors of the memory strings, a program operation with respect to the first memory transistors of the memory strings, and a verify operation with respect to the first memory transistors of the memory strings, in this order. During the read operation, the control circuit determines a first part of the second memory transistors having a threshold voltage higher than a predetermined value and a second part of the second memory transistors not having a threshold voltage higher than the predetermined value. During the verify operation, the control circuit turns on the first transistors during a first sense period while one or more of the bit lines connected to the first part are at a first voltage and one or more of the bit lines connected to the second part are at a second voltage lower than the first voltage, and then turns on the first transistors during a second sense period longer than the first sense period while the one or more of the bit lines connected to the first part are at the second voltage and the one or more of the bit lines connected to the second part are at the first voltage.

In general, according to another embodiment, a semiconductor storage device includes a memory string including first and second memory transistors adjacent to each other, a first wiring connected to a gate of the first memory transistor, a second wiring connected to a gate of the second memory transistor, and a control circuit. The control circuit is configured to perform, during a first write sequence, a read operation with respect to the second memory transistor, a program operation with respect to the first memory transistor, and a verify operation with respect to the first memory transistor, in this order. During the read operation, the control circuit controls the first wiring to be at a read pass voltage and the second wiring to be at a read voltage less than the read pass voltage. During the program operation, the control circuit controls the first wiring to be at a program voltage greater than the read pass voltage and the second wiring to be at a write pass voltage less than the program voltage and greater than the read voltage. During the verify operation, the control circuit controls the first wiring to be at a verify voltage less than the read pass voltage and the second wiring to be at the read pass voltage.

Next, a semiconductor storage device according to certain example embodiments will be described in with reference to the drawings. The following embodiments are merely examples and are not intended to limit the present disclosure. In addition, the following drawings are schematic, and some aspects or components may be omitted for the convenience of description. In addition, elements common to multiple embodiments will be denoted by the same reference symbols, and description thereof may not be repeated for subsequent examples.

The phrase "semiconductor storage device" as used in the present disclosure, may refer to a memory die or a memory system including a control die, such as a memory chip, a memory card, or an SSD (Solid-State Drive). It may also refer to a configuration including a host computer, such as a smart phone, a tablet terminal, or a personal computer, incorporating a memory system.

The phrase "control circuit" as used in the present disclosure, may refer to a circuit such as a sequencer provided in a memory die or a control die or a control chip connected to the memory die, or both.

In the present disclosure, when a first component is said to be "electrically connected" to a second component, the first component may be directly connected to the second component or may be connected to the second component via a wiring, a semiconductor member, or a transistor. For example, when three transistors are connected in series, the first transistor is "electrically connected" to the third transistor even when the second transistor is in the OFF state.

Furthermore, in the present disclosure, when a first component is said to be "connected between" a second component and a third component, this means that the first component, the second component, and the third component are connected in series with each other and that the second component is connected to the third component via the first component.

In the present disclosure, when a circuit is said to "conduct" two wirings, the refers to, for example, a circuit that includes a transistor provided in a current path between the two wirings, and the transistor is in the ON state.

In the present disclosure, a one direction parallel to the upper surface of a substrate is referred to as an X direction, another direction parallel to the upper surface of the substrate and perpendicular to the X direction is referred to as a Y direction, and a direction orthogonal to the upper surface of the substrate is referred to as a Z direction.

Furthermore, in the present disclosure, one direction along a predetermined plane may be referred to as a first direction, another direction intersecting the first direction along the predetermined plane may be referred to as a second direction, and a direction intersecting the predetermined plane may be referred to as a third direction. The first direction, the second direction, and the third direction may or may not correspond to the X direction, the Y direction, and the Z direction.

In the present specification, expressions such as "upper" and "lower" are generally based on distance from the substrate. For example, a direction going away from the substrate along the Z direction is referred to as "upper" direction, an "upward" direction, or the like, and a direction approaching the substrate along the Z direction is referred to as a "lower" direction, a "downward" direction, or the like. Furthermore, references to a lower surface or a lower end of a certain component refers to a surface facing towards the substrate or an end on the substrate side of the component, and an upper surface or an upper end of the certain component refers to a surface facing away from the substrate or an end on the opposite side from the substrate. A surface intersecting the X direction or the Y direction can be referred to as a side surface.

First Embodiment

[Memory System 10]

FIG. 1 is a schematic block diagram illustrating a configuration of a memory system 10 according to a first embodiment.

The memory system 10 reads, writes, and erases user data according to signals transmitted from a host computer 20. The memory system 10 is, for example, a memory chip, a memory card, an SSD, or another system capable of storing user data. The memory system 10 includes a plurality of memory dies MD for storing user data, and a control die CD connected to the plurality of memory dies MD and the host computer 20. The control die CD includes, for example, a processor and a RAM and performs processes such as conversion of a logical address and a physical address, bit error detection/correction, garbage collection (compaction), and wear leveling.

Figure 2:
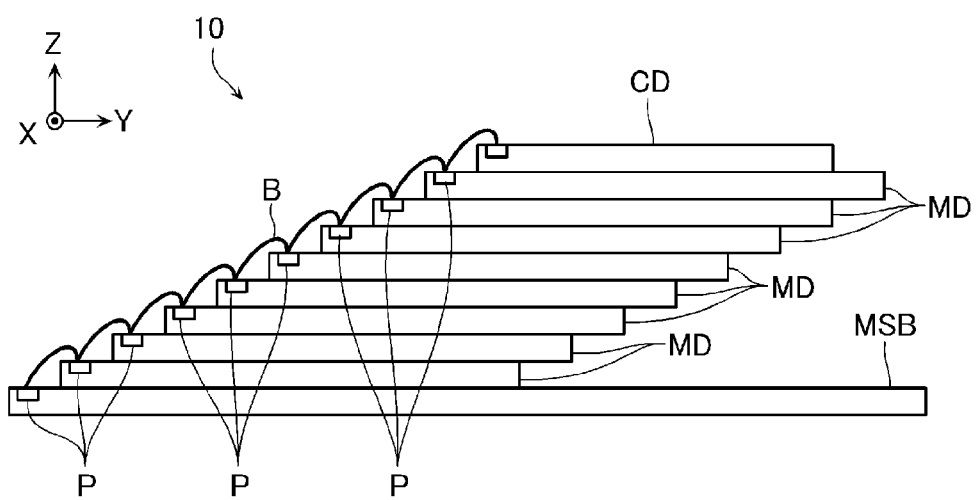
FIG. 2 is a schematic side view illustrating a configuration example of the memory system.
Figure 3:
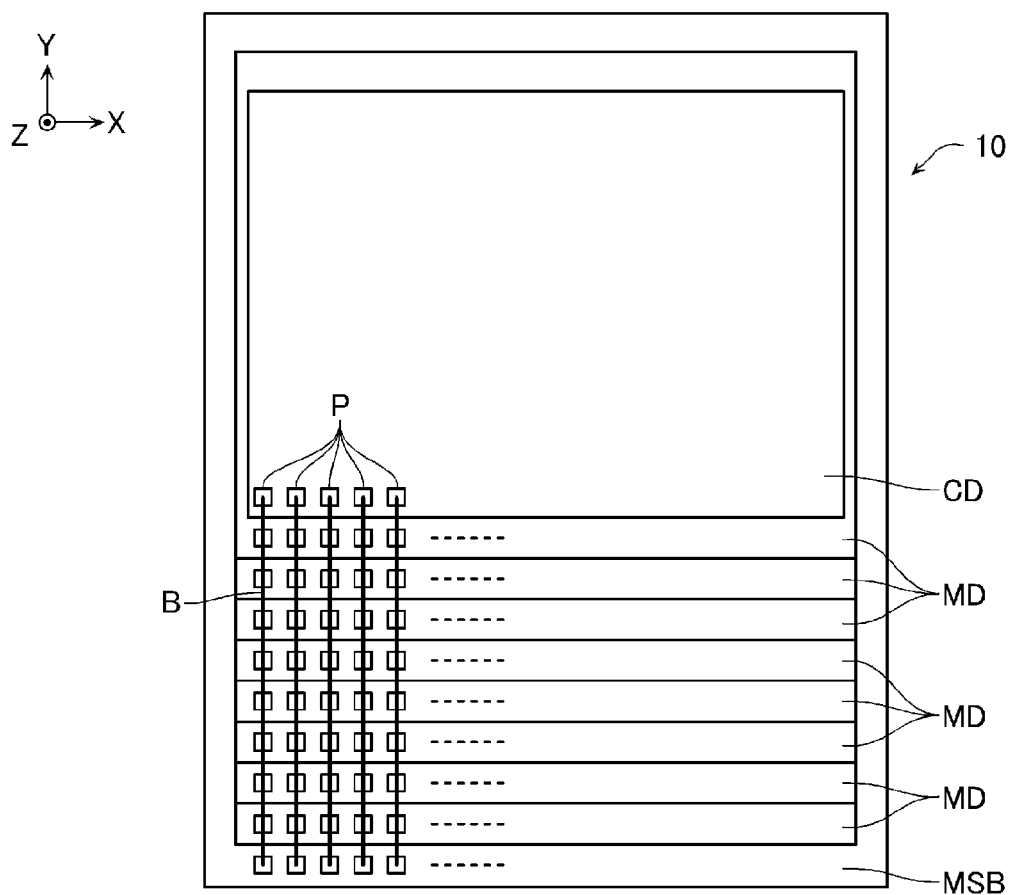
FIG. 3 illustrates a schematic plan view of the same configuration example.

FIG. 2 illustrates a schematic side view of a configuration example of the memory system 10 according to the present embodiment. FIG. 3 illustrates a schematic plan view of the same configuration example. For the convenience of description, a part of the configurations are omitted in FIGS. 2 and 3.

As illustrated in FIG. 2, the memory system 10 according to the present embodiment includes a mounting substrate MSB, a plurality of memory dies MD stacked on the mounting substrate MSB, and a control die CD stacked on the memory dies MD. A pad electrode P is provided in an end region of the upper surface of the mounting substrate MSB in the Y direction, and portions of the other regions thereof are adhered to the lower surface of the memory dies MD via an adhesive. A pad electrode P is provided on an end region of the upper surface of a memory die MD in the Y direction, and the other regions thereof are adhered to the lower surface of another memory die MD or the control die CD via an adhesive. A pad electrode P is provided in an end region of the upper surface of the control die CD in the Y direction.

As illustrated in FIG. 3, the mounting substrate MSB, the plurality of memory dies MD, and the control die CD each include a plurality of pad electrodes P arranged in the X direction. The plurality of pad electrodes P provided on the mounting substrate MSB, the plurality of memory dies MD, and the control die CD are each interconnected via bonding wires B.

The configurations illustrated in FIGS. 2 and 3 are merely examples, and the specific configurations thereof may be adjusted as appropriate. For example, in the examples illustrated in FIGS. 2 and 3, control dies CD are stacked on the plurality of memory dies MD, and this configuration is connected by a bonding wire B. In such a configuration, the plurality of memory dies MD and the control dies CD are provided in a single package. However, the control dies CD may be provided in a package separated from the memory dies MD. Further, the plurality of memory dies MD and the control dies CD may be interconnected via through-electrodes instead of the bonding wires B.

[Circuit Configuration of Memory Die MD]

Figure 4:
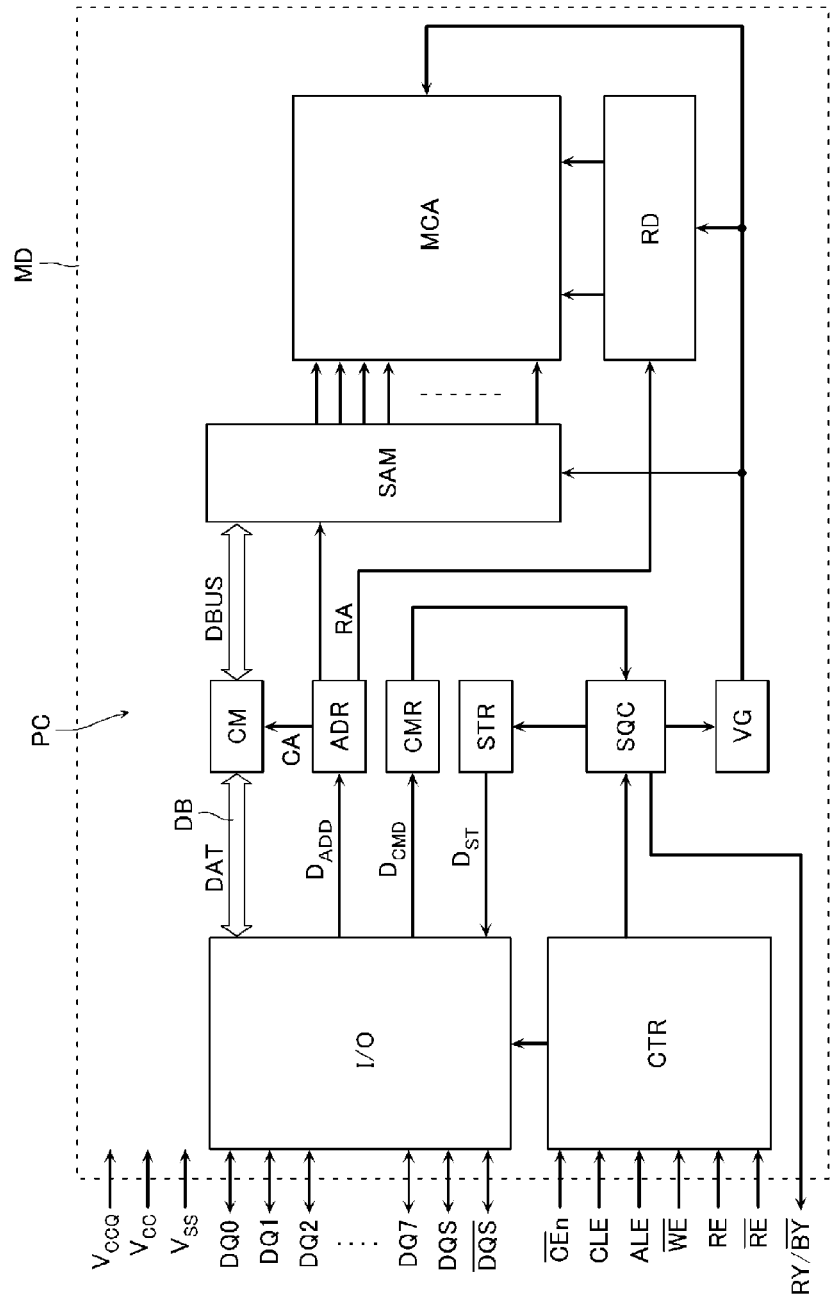
FIG. 4 is a schematic block diagram illustrating the configuration of a memory die according to the first embodiment.
Figure 5:
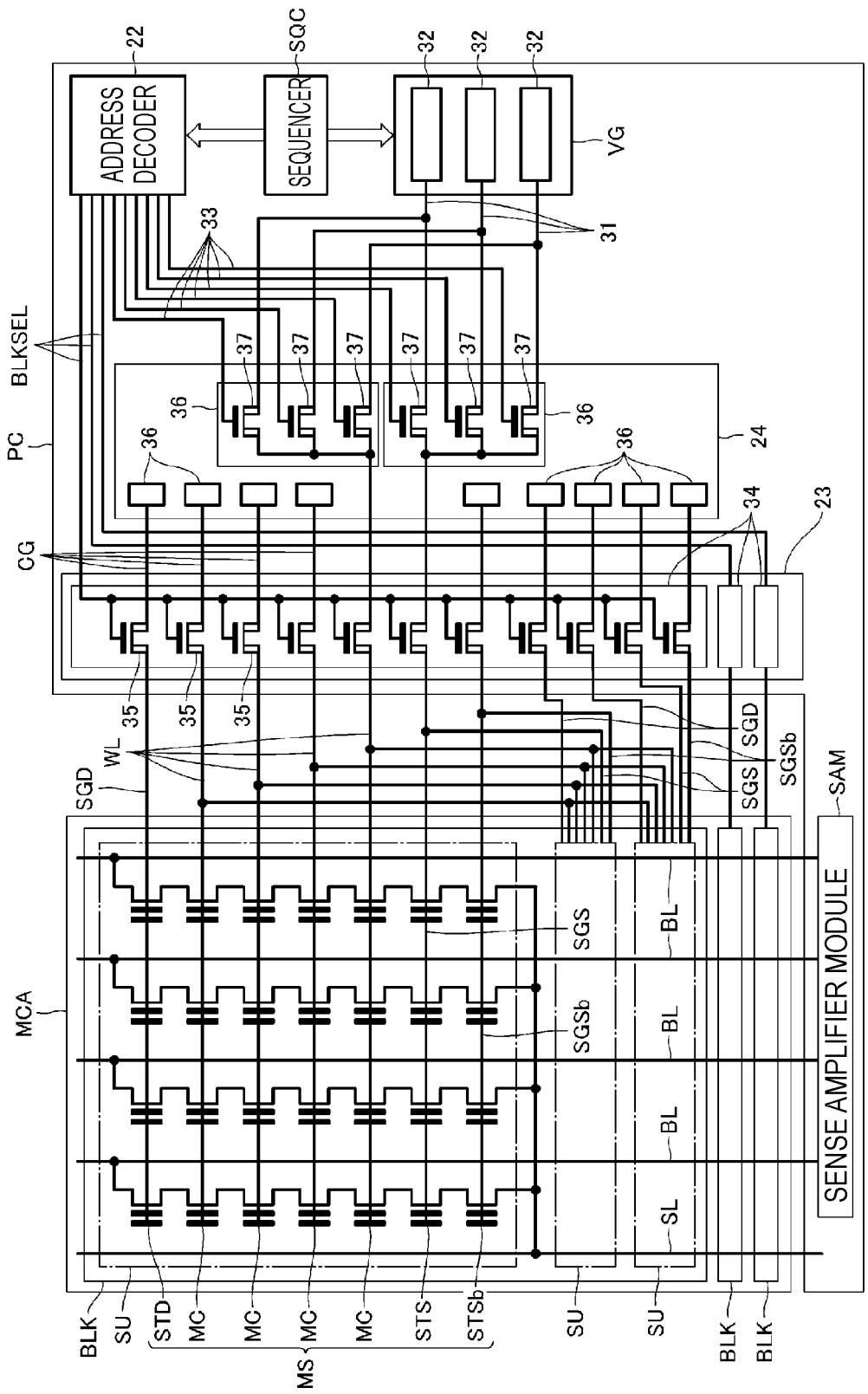
FIG. 5 is a schematic circuit diagram illustrating a part of the configuration of the memory die.
Figure 6:
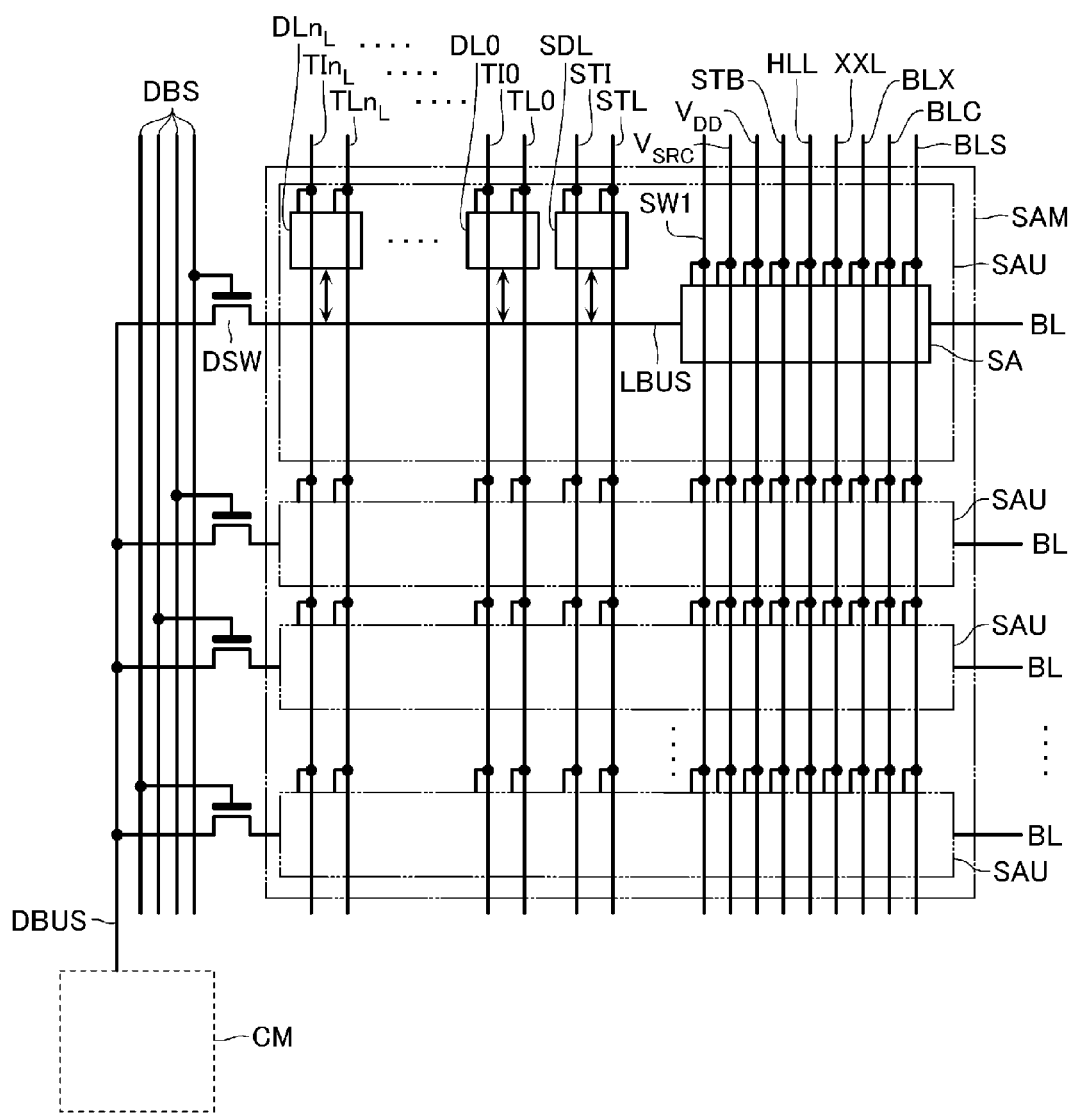
FIG. 6 is a schematic circuit diagram illustrating a part of the configuration of the memory die.
Figure 7:
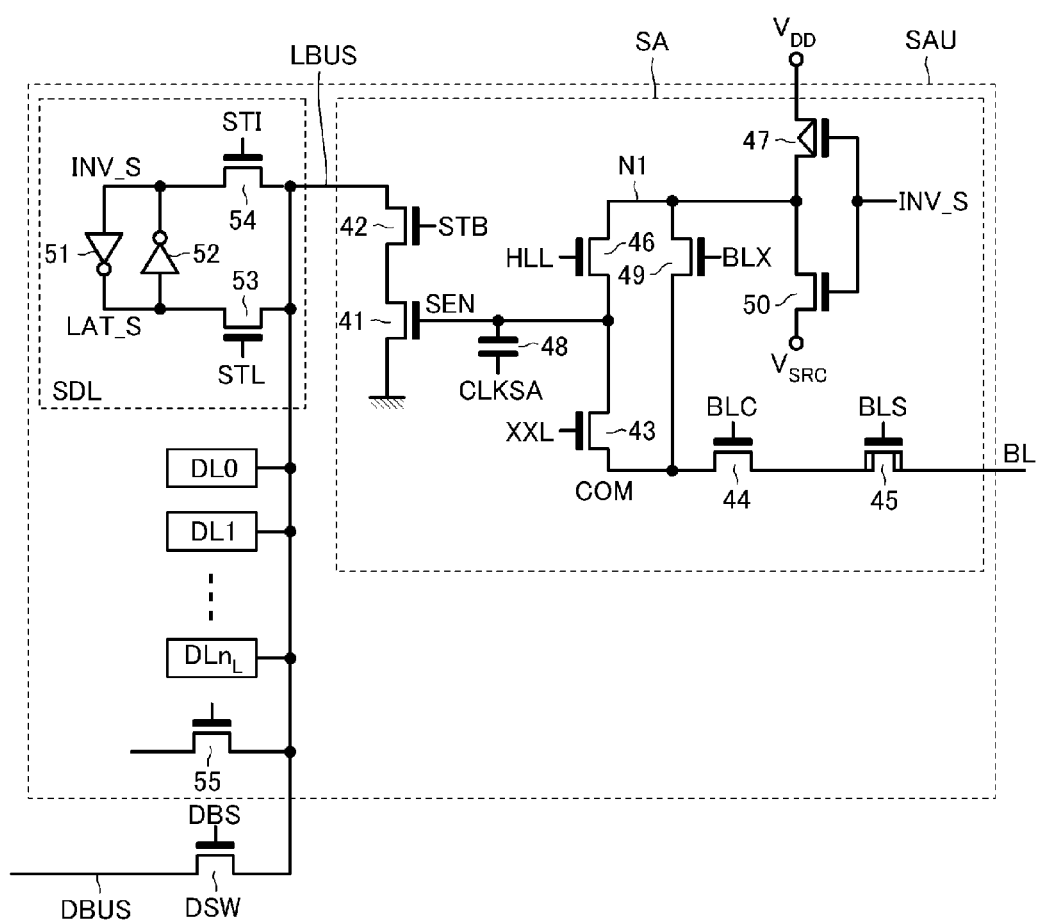
FIG. 7 is a schematic circuit diagram illustrating a part of the configuration of the memory die.

FIG. 4 is a schematic block diagram illustrating a configuration of a memory die MD according to the first embodiment. FIGS. 5 to 7 are schematic circuit diagrams illustrating a part of the configuration of the memory die MD.

FIG. 4 illustrates a plurality of control terminals. The plurality of control terminals may be represented as a control terminal corresponding to a high active signal (positive logic signal), a control terminal corresponding to a low active signal (negative logic signal), and a control terminal corresponding to both the high active signal and the low active signal, respectively. In FIG. 4, the sign of the control terminal corresponding to the low active signal includes an over-line (top line). In the present disclosure, the sign of the control terminal corresponding to the low active signal includes a slash ("/"). The description in FIG. 4 is an example, and the specific aspect thereof may be adjusted as appropriate. For example, all or a part of high active signals may be set to a low active signal, or all or a part of low active signals may be set to a high active signal.

As illustrated in FIG. 4, the memory die MD includes a memory cell array MCA that stores data, and a peripheral circuit PC connected to the memory cell array MCA. The peripheral circuit PC includes a voltage generation circuit VG, a row decoder RD, a sense amplifier module SAM, and a sequencer SQC. Further, the peripheral circuit PC includes a cache memory CM, an address register ADR, a command register CMR, and a status register STR. Further, the peripheral circuit PC includes an input/output control circuit I/O and a logic circuit CTR.

[Circuit Configuration of Memory Cell Array MCA]

As illustrated in FIG. 5, the memory cell array MCA includes a plurality of memory blocks BLK. The plurality of memory blocks BLK includes a plurality of string units SU, respectively. The plurality of string units SU includes a plurality of memory strings MS, respectively. One ends of the plurality of memory strings MS are connected to the peripheral circuit PC via bit lines BL, respectively. Further, the other ends of the plurality of memory strings MS are connected to the peripheral circuit PC via a common source line SL.

Each memory string MS includes a drain side select transistor STD, a plurality of memory cells MC (memory transistors), a source side select transistor STS, and a source side select transistor STSb that are connected in series between the bit line BL and the source line SL. Hereinafter, the drain side select transistor STD, the source side select transistor STS, and the source side select transistor STSb may be simply referred to as select transistors (STD, STS, and STSb).

Each memory cell MC is a field effect transistor having a semiconductor layer functioning as a channel region, a gate insulating film including a charge storage film, and a gate electrode. A threshold voltage of the memory cell MC changes according to the amount of charges in the charge storage film. The memory cell MC stores one-bit or multiple-bit data. Word lines WL are connected to the gate electrodes of the plurality of memory cells MC corresponding to one memory string MS, respectively. The word lines WL are connected in common to all memory strings MS in one memory block BLK, respectively.

Each of the select transistors (STD, STS, and STSb) is a field effect transistor having a semiconductor layer functioning as a channel region, a gate insulating film, and a gate electrode. Selected gate lines (SGD, SGS, and SGSb) are connected to the gate electrodes of the select transistors (STD, STS, and STSb), respectively. The drain side selected gate line SGD is provided corresponding to a string unit SU and is connected in common to all memory strings MS in one string unit SU. The source side selected gate line SGS is connected in common to all memory strings MS in a plurality of string units SU. The source side selected gate line SGSb is connected in common to all the memory strings MS in the plurality of string units SU.

[Circuit Configuration of Voltage Generation Circuit VG]

For example, as illustrated in FIG. 5, the voltage generation circuit VG (see FIG. 4) is connected to a plurality of voltage supply lines 31. The voltage generation circuit VG includes, for example, a step-down circuit such as a regulator, and a step-up circuit such as a charge pump circuit 32. These step-down circuit and step-up circuit are connected to voltage supply lines to which a power source voltage $V_{CC}$ and a ground voltage $V_{SS}$ (see FIG. 4) are supplied, respectively. These voltage supply lines are connected to, for example, the pad electrodes P described with reference to FIGS. 2 and 3. The voltage generation circuit VG generates a plurality of operation voltages applied to bit lines BL, source lines SL, word lines WL, and selected gate lines (SGD, SGS, and SGSb) in a read operation, a write operation, and an erase operation for a memory cell array MCA, according to control signals from, for example, the sequencer SQC, and output the operation voltages to the plurality of voltage supply lines 31 at the same time. The operation voltages output from the voltage supply lines 31 are appropriately adjusted according to control signals from the sequencer SQC.

[Circuit Configuration of Row Decoder RD]

For example, as illustrated in FIG. 5, the row decoder RD (see FIG. 4) includes an address decoder 22 that decodes address data $D_{ADD}$, and a block selection circuit 23 and a voltage selection circuit 24 that transfer the operation voltages to a memory cell array MCA according to the output signals of the address decoder 22.

The address decoder 22 includes a plurality of block selection lines BLKSEL and a plurality of voltage selection lines 33. The address decoder 22 sequentially refers to a row address RA of an address register ADR (see FIG. 4) according to a control signal from, for example, the sequencer SQC, and decodes the row address RA to set predetermined block select transistor 35 and voltage select transistor 37 corresponding to the row address RA to an ON state and set the other block select transistors 35 and voltage select transistors 37 to an OFF state. For example, voltages of predetermined block selection line BLKSEL and voltage selection line 33 are set to an "H" state, and the other voltages thereof are set to an "L" state. When a P-channel type transistor is used instead of an N-channel type transistor, a reverse voltage is applied to these lines.

In the illustrated example, in the address decoder 22, one block selection line BLKSEL is provided for each memory block BLK. However, this configuration may be changed as appropriate. For example, one block selection line BLKSEL may be provided for two or more memory blocks BLK.

The block selection circuit 23 includes a plurality of block selection units 34 corresponding to the memory block BLK. The plurality of block selection units 34 includes a plurality of block select transistors 35 corresponding to the word line WL and the selected gate lines (SGD, SGS, and SGSb), respectively. Each block select transistor 35 is, for example, a field effect withstand voltage transistor. The drain electrodes of the block select transistors 35 are electrically connected to the corresponding word lines WL or selected gate lines (SGD, SGS, and SGSb), respectively. The source electrodes thereof are electrically connected to the voltage supply lines 31 via wirings CG and the voltage selection circuit 24, respectively. The gate electrodes thereof are connected in common to the corresponding block selection line BLKSEL.

The block selection circuit 23 further includes a plurality of transistors (not illustrated). The plurality of transistors are field effect withstand voltage transistors connected between the selected gate lines (SGD, SGS, and SGSb) and the voltage supply lines to which the ground voltage $V_{SS}$ is supplied. The plurality of transistors supply the ground voltage $V_{SS}$ to selected gate lines (SGD, SGS, and SGSb) in an unselected memory block BLK. A plurality of word lines WL in the unselected memory block BLK is in a floating state.

The voltage selection circuit 24 includes a plurality of voltage selection units 36 corresponding to the word lines WL and the selected gate lines (SGD, SGS, and SGSb). The plurality of voltage selection units 36 includes a plurality of voltage select transistors 37, respectively. Each of the voltage select transistors 37 is, for example, a field effect withstand voltage transistor. The drain terminals of the voltage select transistors 37 are electrically connected to the corresponding word lines WL or selected gate lines (SGD, SGS, and SGSb) via the wirings CG and the block selection circuit 23, respectively. The source terminals thereof are electrically connected to the corresponding voltage supply lines 31, respectively. The gate electrodes thereof are connected to the corresponding voltage selection lines 33, respectively.

In the illustrated example, a case where the wirings CG are connected to the voltage supply lines 31 via one voltage select transistor 37 is illustrated. However, such a configuration is merely an example, and the specific configuration thereof may be adjusted as appropriate. For example, the wirings CG may be connected to the voltage supply lines 31 via two or more voltage select transistors 37.

[Circuit Configuration of Sense Amplifier Module SAM]

For example, as illustrated in FIG. 6, the sense amplifier module SAM (see FIG. 4) includes a plurality of sense amplifier units SAU corresponding to a plurality of bit lines BL. Each of the sense amplifier units SAU includes a sense amplifier SA connected to a bit line BL, a wiring LBUS connected to the sense amplifier SA, latch circuits SDL and DL0 to $DLn_L$ ($n_L$ is a natural number) connected to the wiring LBUS, and a charging transistor 55 (see FIG. 7) for pre-charging, which is connected to the wiring LBUS. The wiring LBUS in the sense amplifier unit SAU is connected to a wiring DBUS via a switch transistor DSW.

As illustrated in FIG. 7, the sense amplifier SA includes a sense transistor 41 that discharges charges of the wiring LBUS according to a current flowing through the bit line BL. The source electrode of the sense transistor 41 is connected to a voltage supply line to which the ground voltage $V_{SS}$ is supplied. The drain electrode thereof is connected to the wiring LBUS via a switch transistor 42. The gate electrode thereof is connected to the bit line BL via a sense node SEN, a discharging transistor 43, a node COM, a clamp transistor 44, and a withstand voltage transistor 45. Also, the sense node SEN is connected to an internal control signal line CLKSA via a capacitor 48.

Further, the sense amplifier SA includes a voltage transfer circuit that causes the node COM and the sense node SEN to selectively conduct with a voltage supply line to which a voltage $V_{DD}$ is supplied or a voltage supply line to which a voltage $V_{SRC}$ is supplied, according to data latched by a latch circuit SDL. The voltage transfer circuit includes a node N1, a charging transistor 46 connected between the node N1 and the sense node SEN, a charging transistor 49 connected between the node N1 and the node COM, a charging transistor 47 connected between the node N1 and the voltage supply line to which the voltage $V_{DD}$ is supplied, and a discharging transistor 50 connected between the node N1 and the voltage supply line to which the voltage $V_{SRC}$ is supplied. The gate electrodes of the charging transistor 47 and the discharging transistor 50 are connected in common to a node INV_S of the latch circuit SDL.

The sense transistor 41, the switch transistor 42, the discharging transistor 43, the clamp transistor 44, the charging transistor 46, the charging transistor 49, and the discharging transistor 50 are, for example, enhancement type NMOS transistors. The withstand voltage transistor 45 is, for example, a depletion type NMOS transistor. The charging transistor 47 is, for example, a PMOS transistor.

Further, the gate electrode of the switch transistor 42 is connected to a signal line STB. The gate electrode of the discharging transistor 43 is connected to a signal line XXL. The gate electrode of the clamp transistor 44 is connected to a signal line BLC. The gate electrode of the withstand voltage transistor 45 is connected to a signal line BLS. The gate electrode of the charging transistor 46 is connected to a signal line HLL. The gate electrode of the charging transistor 49 is connected to a signal line BLX. These signal lines STB, XXL, BLC, BLS, HLL, and BLX are connected to the sequencer SQC.

The latch circuit SDL includes nodes LAT_S and INV_S, an inverter 51 having an output terminal connected to the node LAT_S and an input terminal connected to the node INV_S, an inverter 52 having an input terminal connected to the node LAT_S and an output connected to the node INV_S, a switch transistor 53 connected to the node LAT_S and the wiring LBUS, and a switch transistor 54 connected to the node INV_S and the wiring LBUS. The switch transistors 53 and 54 are, for example, NMOS transistors. The gate electrode of the switch transistor 53 is connected to the sequencer SQC via a signal line STL. The gate electrode of the switch transistor 54 is connected to the sequencer SQC via a signal line STI.

The latch circuits DL0 to $DLn_L$ are configured in substantially the same manner as the latch circuit SDL. However, as described above, the node INV_S of the latch circuit SDL connects with the gate electrodes of the charging transistor 47 and the discharging transistor 50 in the sense amplifier SA. The latch circuits DL0 to $DLn_L$ are different from the latch circuits SDL in this point.

The switch transistor DSW is, for example, an NMOS transistor. The switch transistor DSW is connected between the wiring LBUS and the wiring DBUS. The gate electrode of the switch transistor DSW is connected to the sequencer SQC via a signal line DBS (see FIG. 6).

As illustrated in FIG. 6, the above-mentioned signal lines STB, HLL, XXL, BLX, BLC, and BLS are connected in common among all the sense amplifier units SAU in the sense amplifier module SAM, respectively. Further, the voltage supply line to which the voltage $V_{DD}$ is supplied and the voltage supply line to which the voltage $V_{SRC}$ is supplied are connected in common among all the sense amplifier units SAU in the sense amplifier module SAM, respectively. Further, the signal line STI and the signal line STL of the latch circuit SDL are connected in common among all the sense amplifier units SAU in the sense amplifier module SAM, respectively. Similarly, signal lines STI in the latch circuits DL0 to $DLn_L$ and signal lines TI0 to $TIn_L$ and TL0 to $TLn_L$ corresponding to the signal lines STL are connected in common among all the sense amplifier units SAU in the sense amplifier module SAM, respectively. A plurality of signal lines DBS is provided corresponding to all the sense amplifier units SAU in the sense amplifier module SAM, respectively.

[Circuit Configuration of Cache Memory CM]

The cache memory CM (see FIG. 4) includes a plurality of latch circuits connected to the latch circuits DL0 to $DLn_L$ in the sense amplifier module SAM via the wiring DBUS. Data DAT in the plurality of latch circuits are sequentially transferred to the sense amplifier module SAM or the input/output control circuit I/O.

A decoding circuit and a switch circuit can be connected to the cache memory CM. The decoding circuit decodes a column address CA stored in the address register ADR (see FIG. 4). The switch circuit connects to a latch circuit corresponding to the column address CA with the bus DB (see FIG. 4) according to an output signal of the decoding circuit.

[Circuit Configuration of Sequencer SQC]

The sequencer SQC (see FIG. 4) outputs an internal control signal to the row decoder RD, the sense amplifier module SAM, and the voltage generation circuit VG according to command data $D_{CMD}$ stored in the command register CMR. Further, the sequencer SQC outputs status data $D_{ST}$ indicating its own state as appropriate to the status register STR.

In addition, the sequencer SQC generates a ready/busy signal and outputs it to a terminal RY//BY. In a period in which the terminal RY//BY is in an "L" state (busy period), access to the memory die MD is basically inhibited. Further, in a period in which the terminal RY//BY is in an "H" state (ready period), access to the memory die MD is permitted. The terminal RY//BY is implemented by, for example, the pad electrodes P described with reference to FIGS. 2 and 3.

[Circuit Configuration of Input/Output Control Circuit I/O]

The input/output control circuit I/O includes data signal input/output terminals DQ0 to DQ7, clock signal input/output terminals DQS and /DQS, an input circuit such as a comparator connected to the data signal input/output terminals DQ0 to DQ7, and an output circuit such as an OCD (Off Chip Driver) circuit connected to the data signal input/output terminals DQ0 to DQ7. Further, the input/output control circuit I/O includes a shift register connected to these input circuit and output circuit, and a buffer circuit. The input circuit, the output circuit, the shift register, and the buffer circuit are connected to terminals to which a power supply voltage $V_{CCQ}$ and the ground voltage $V_{SS}$ are supplied, respectively. The data signal input/output terminals DQ0 to DQ7, the clock signal input/output terminals DQS and /DQS, and the terminal to which the power supply voltage $V_{CCQ}$ is supplied are implemented by, for example, the pad electrodes P described with reference to FIGS. 2 and 3. Data input via the data signal input/output terminals DQ0 to DQ7 are output from the buffer circuit to the cache memory CM, the address register ADR, or the command register CMR according to an internal control signal from the logic circuit CTR. Further, the data output via the data signal input/output terminals DQ0 to DQ7 are input from the cache memory CM or the status register STR to the buffer circuit according to an internal control signal from the logic circuit CTR.

[Circuit Configuration of Logic Circuit CTR]

The logic circuit CTR (see FIG. 4) receives external control signals from the control die CD via external control terminals /CEn, CLE, ALE, /WE, RE, and /RE and outputs internal control signals to the input/output control circuit I/O accordingly. The external control terminals /CEn, CLE, ALE, /WE, RE, and /RE are implemented by, for example, the pad electrodes P described with reference to FIGS. 2 and 3.

[Structure of Memory Die MD]

Figure 8:
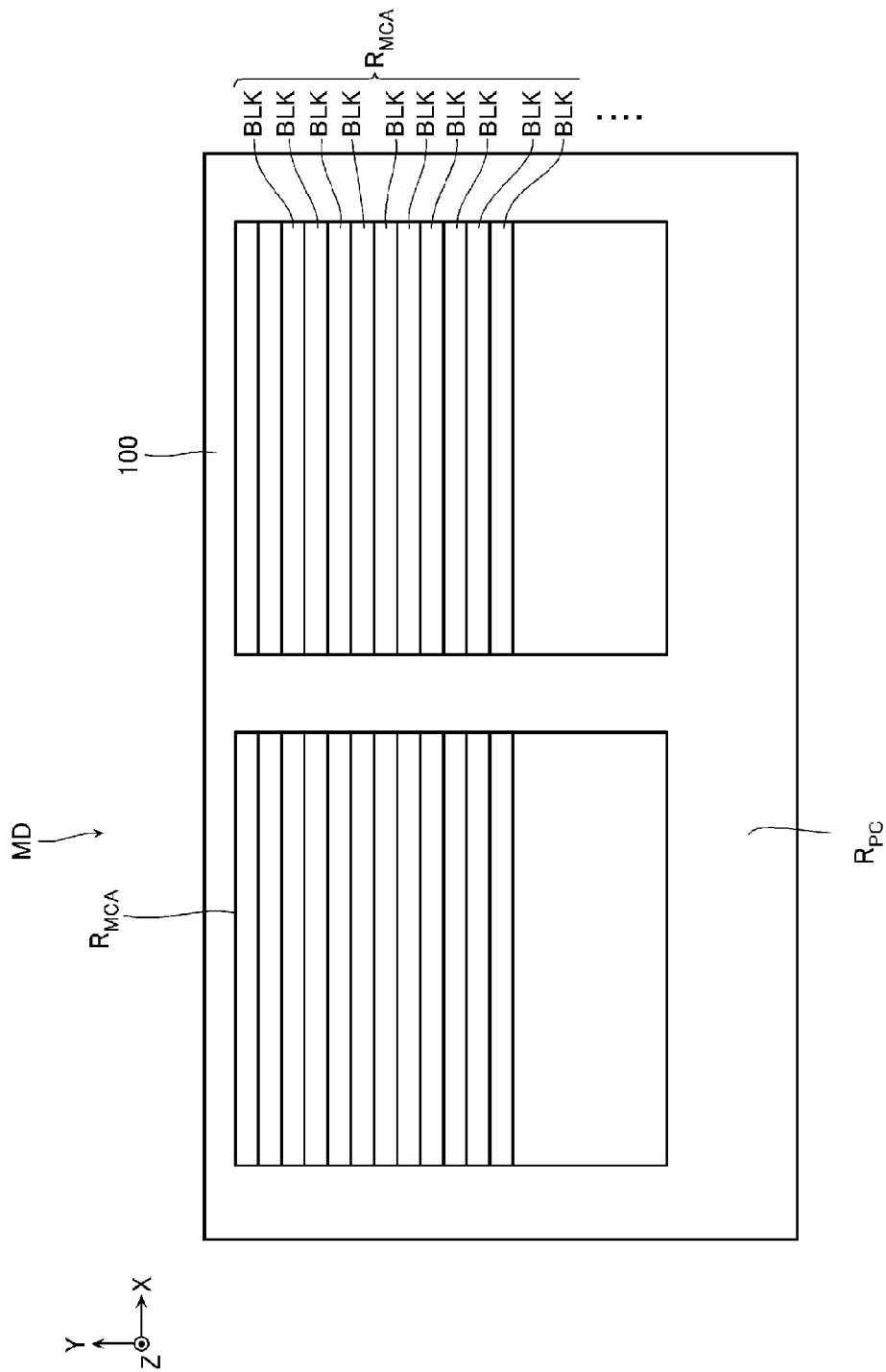
FIG. 8 illustrates a schematic plan view of the memory die.
Figure 9:
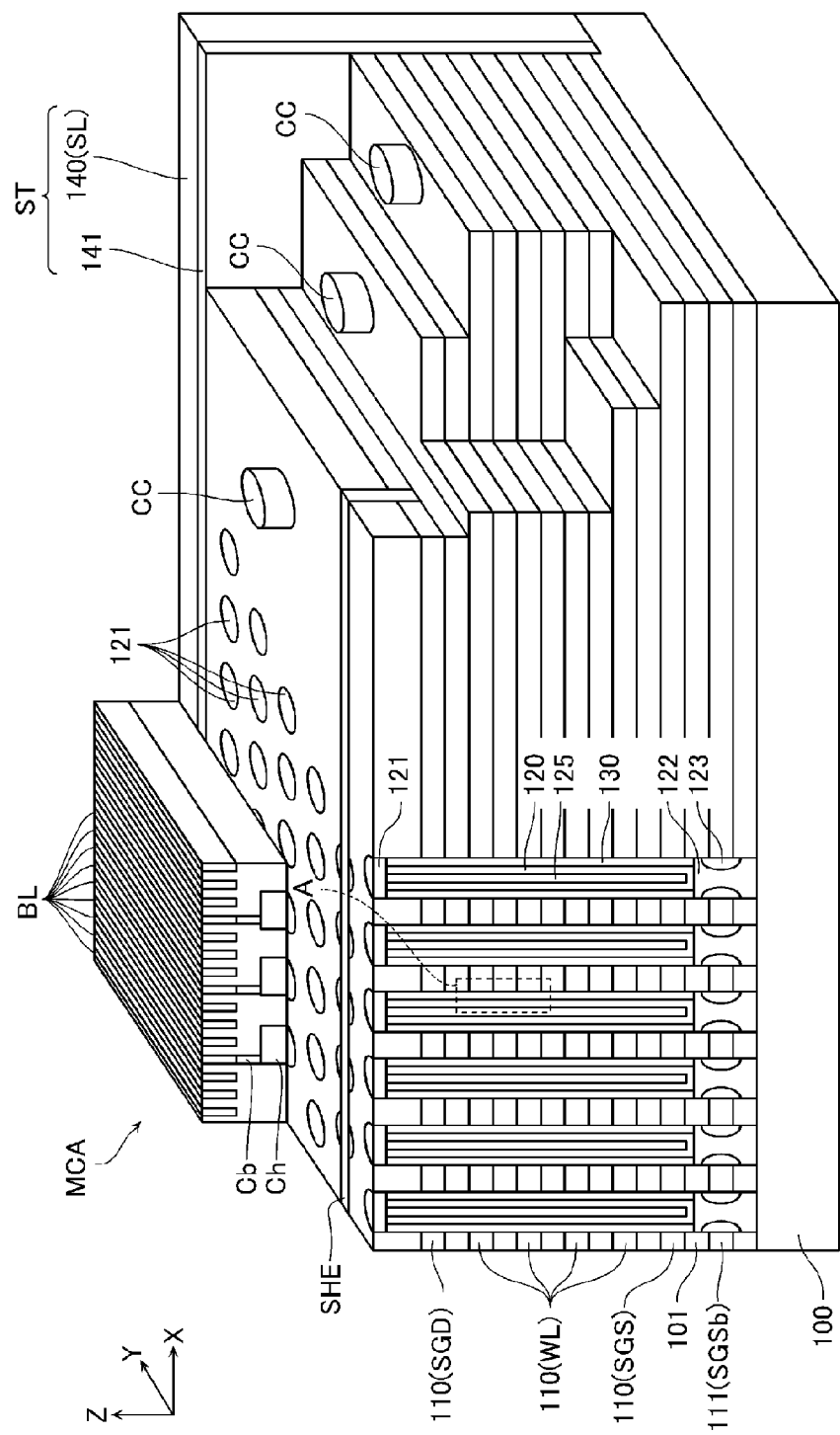
FIG. 9 illustrates a schematic perspective view of a part of the configuration of the memory die.
Figure 10:
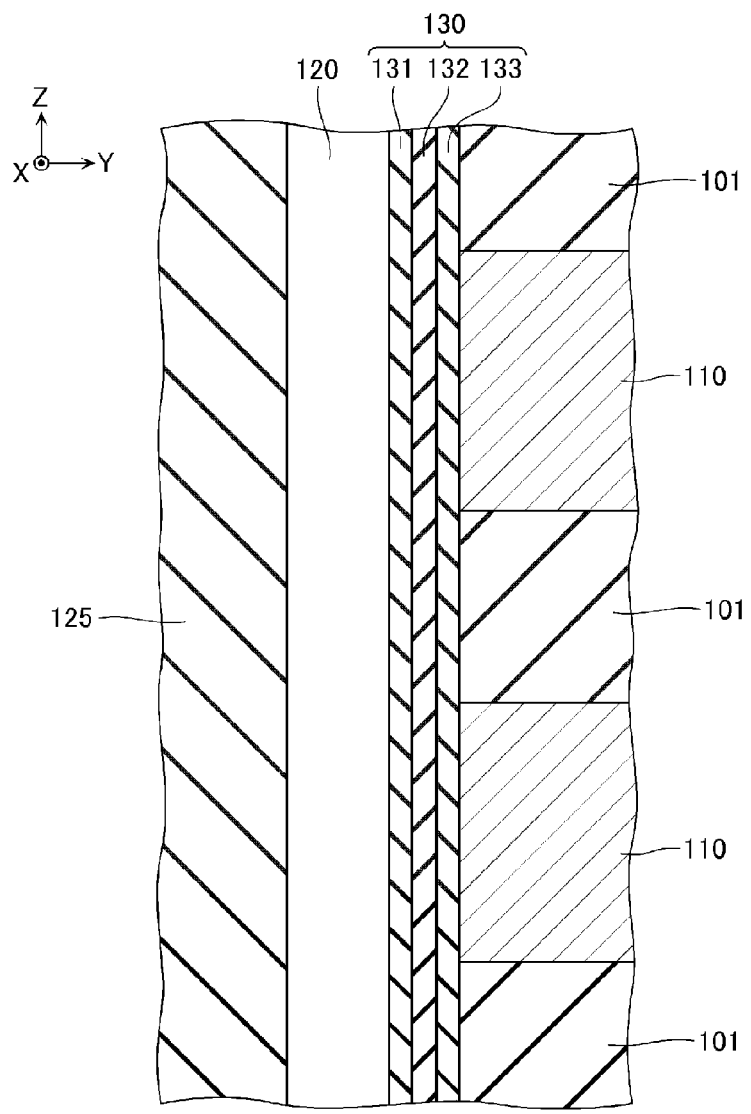
FIG. 10 illustrates a schematic enlarged view of a portion indicated by a symbol A in FIG. 9.

FIG. 8 illustrates a schematic plan view of the memory die MD. FIG. 9 illustrates a schematic perspective view of a part of the configuration of the memory die MD. FIG. 10 illustrates a schematic enlarged view of a portion indicated by A in FIG. 9.

As illustrated in FIG. 8, the memory die MD includes a semiconductor substrate 100. In the illustrated example, two memory cell array regions $R_{MCA}$ arranged in the X direction are provided in the semiconductor substrate 100. A plurality of memory blocks BLK arranged in the Y direction is provided in each of the memory cell array regions $R_{MCA}$. An inter-block structure ST (see FIG. 9) is provided between two memory blocks BLK adjacent to each other in the Y direction. Further, a peripheral circuit region $R_Pc$ (see FIG. 8) is provided in a region outside the two memory cell array regions $R_{MCA}$.

The semiconductor substrate 100 is, for example, a semiconductor substrate made of P-type silicon (Si) containing P-type impurities such as boron (B). For example, an N-type well region containing N-type impurities such as phosphorus (P), a P-type well region containing P-type impurities such as boron (B), a semiconductor substrate region in which the N-type well region and the P-type well region are not provided, and an insulating region are provided on the surface of the semiconductor substrate 100. The N-type well region, the P-type well region, and the semiconductor substrate region each function as parts of a plurality of transistors and a plurality of capacitors constituting the peripheral circuit PC.

For example, as illustrated in FIG. 9, the memory block BLK includes a plurality of conductive layers 110 arranged in the Z direction, a plurality of semiconductor layers 120 extending in the Z direction, and a plurality of gate insulating films 130 provided between the plurality of conductive layers 110 and the plurality of semiconductor layers 120, respectively.

Each of the conductive layers 110 is substantially a plate-shaped conductive layer extending in the X direction. The conductive layer 110 may include a stacked film of a barrier conductive film such as titanium nitride (TiN) and a metal film such as tungsten (W). Further, the conductive layer 110 may contain, for example, polycrystalline silicon containing impurities such as phosphorus (P) and boron (B).

An insulating layer 101 such as silicon oxide (SiO$_2$) is provided between the plurality of conductive layers 110 arranged in the Z direction.

A conductive layer 111 is provided below the conductive layer 110. The conductive layer 111 may include, for example, a stacked film of a barrier conductive film such as titanium nitride (TiN) and a metal film such as tungsten (W). Further, an insulating layer 101 such as silicon oxide (SiO$_2$) is provided between the conductive layer 111 and the conductive layer 110.

The conductive layer 111 functions as a gate electrode of the source side selected gate line SGSb (see FIG. 5) and the plurality of source side select transistors STSb connected thereto. The conductive layer 111 is electrically independent for each memory block BLK.

Among the plurality of conductive layers 110, one or more conductive layers 110 located at the lowest layer function as gate electrodes of the source side selected gate line SGS (see FIG. 5) and the plurality of source side select transistors STS connected thereto.

A plurality of conductive layers 110 located above the conductive layers 110 function as gate electrodes of the word line WL (see FIG. 5) and the plurality of memory cells MC (see FIG. 5) connected thereto. The plurality of conductive layers 110 are electrically connected to a plurality of conductive layers 110 adjacent to each other in the X direction, respectively. Further, each of the plurality of conductive layers 110 is electrically independent for each memory block BLK.

One or more conductive layers 110 located above the conductive layers 110 function as gate electrodes of the drain side selected gate line SGD and the plurality of drain side select transistors STD (see FIG. 5) connected thereto. For example, as illustrated in FIG. 9, an inter-string unit insulating layer SHE is provided between two conductive layers 110 adjacent to each other in the Y direction. Each of the plurality of conductive layers 110 is electrically independent for each string unit SU.

A connection portion with a plurality of contacts CC is provided at an end portion of the plurality of conductive layers 110 in the X direction. The plurality of contacts CC extend in the Z direction and is connected to the conductive layers 110 at the lower end. Each of the contacts CC may include, for example, a stacked film of a barrier conductive film such as titanium nitride (TiN) and a metal film such as tungsten (W).

The semiconductor layers 120 are arranged in a predetermined pattern in the X direction and the Y direction. Each of the semiconductor layers 120 functions as a channel region of a plurality of memory cells MC and selective transistors (STD, STS, and STSb) in one memory string MS (see FIG. 1). The semiconductor layer 120 is, for example, a semiconductor layer such as polycrystalline silicon (Si). The semiconductor layer 120 has, for example, a cylindrical shape, and an insulating layer 125 such as silicon oxide is provided at a central portion thereof. Further, the outer peripheral surfaces of the semiconductor layers 120 are surrounded by the conductive layers 110, respectively, to face the conductive layers 110.

An impurity region 121 containing N-type impurities such as phosphorus (P) is provided at the upper end of the semiconductor layer 120. The impurity region 121 is connected to the bit line BL extending in the Y direction via a contact Ch and a contact Cb.

The lower end of the semiconductor layer 120 is connected to the P-type well region of the semiconductor substrate 100 via a semiconductor layer 122 made of single crystal silicon (Si). The semiconductor layer 122 functions as a channel region of the source side select transistor STSb. The outer peripheral surface of the semiconductor layer 122 is surrounded by the conductive layer 111 to face the conductive layer 111. An insulating layer 123 such as silicon oxide is provided between the semiconductor layer 122 and the conductive layer 111.

Each of the gate insulating films 130 has a cylindrical shape that covers the outer peripheral surface of the semiconductor layer 120.

For example, as illustrated in FIG. 10, the gate insulating film 130 includes a tunnel insulating film 131, a charge storage film 132, and a block insulating film 133 which are stacked between the semiconductor layer 120 and the conductive layer 110. The tunnel insulating film 131 and the block insulating film 133 are, for example, insulating films such as silicon oxide (SiO$_2$). The charge storage film 132 is, for example, a film capable of storing charges such as silicon nitride (Si$_3$N$_4$). The tunnel insulating film 131, the charge storage film 132, and the block insulating film 133 have a cylindrical shape and extend in the Z direction along the outer peripheral surface of the semiconductor layer 120.

FIG. 10 illustrates an example in which the gate insulating film 130 includes the charge storage film 132 such as silicon nitride. However, the gate insulating film 130 may include, for example, a floating gate such as polycrystalline silicon containing N-type or P-type impurities.

For example, as illustrated in FIG. 9, the inter-block structure ST includes a conductive layer 140 extending in the Z direction and the X direction, and an insulating layer 141 provided on the side surface of the conductive layer 140. The conductive layer 140 is connected to an N-type impurity region provided in the P-type well region of the semiconductor substrate 100. The conductive layer 140 may include, for example, a stacked film of a barrier conductive film such as titanium nitride (TiN) and a metal film such as tungsten (W). The conductive layer 140 functions, for example, as a part of the source line SL (see FIG. 5).

[Threshold Voltage of Memory Cell MC]

Next, a threshold voltage of the memory cell MC will be described with reference to FIG. 11.

As described above, the memory cell array MCA includes a plurality of memory cells MC. When a write sequence is performed on the plurality of memory cells MC, threshold voltages of the memory cells MC are controlled to have a plurality of states.

Figure 11:
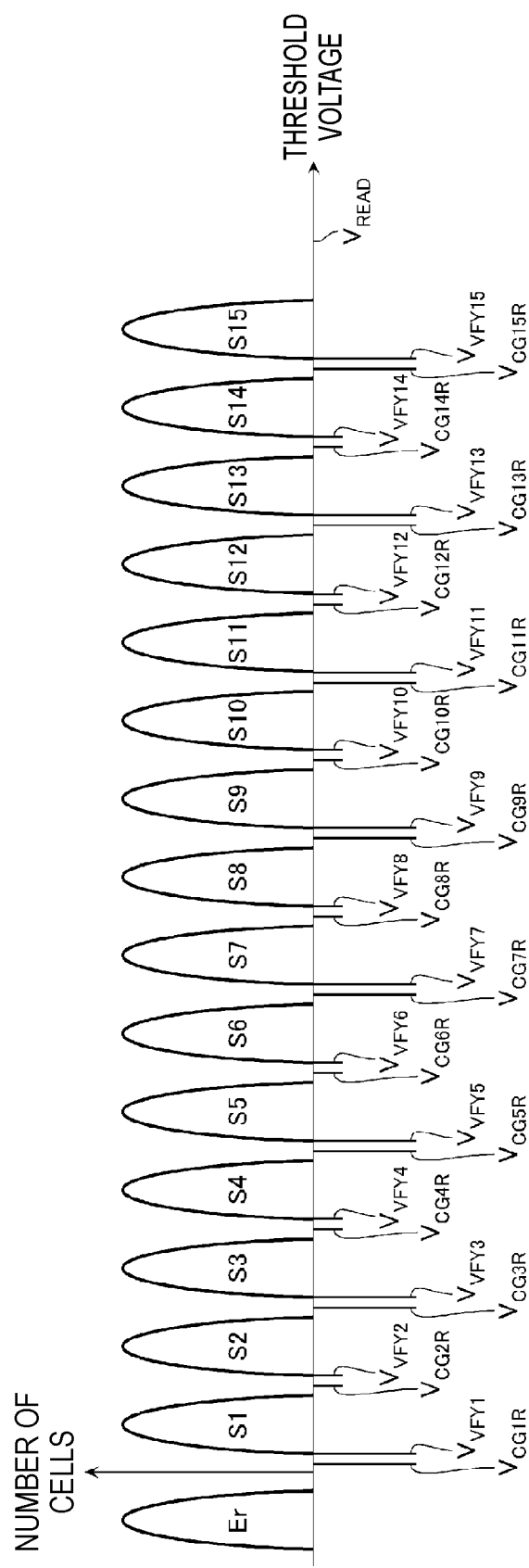
FIG. 11 is a schematic histogram showing a threshold voltage distribution of a memory cell.

FIG. 11 is a schematic histogram showing a threshold voltage distribution of a memory cell MC in which 4-bit data is recorded. The horizontal axis represents a voltage of the word line WL, and the vertical axis represents the number of memory cells MC.

In the example of FIG. 11, the threshold voltage of the memory cell MC is controlled to have 16 different states. For example, the threshold voltage of the memory cell MC controlled in an S1 state is larger than a read voltage $V_{CG1R}$ and a verify voltage $V_{VFY1}$ in FIG. 11 and smaller than a read voltage $V_{CG2R}$ and a verify voltage $V_{VFY2}$. Further, the threshold voltages of all the memory cells MC are smaller than a read pass voltage $V_{READ}$ of FIG. 11.

For example, an Er state corresponds to the lowest threshold voltage (threshold voltage of the memory cell MC in an erase state). For example, data "1111" may be allocated to the memory cell MC corresponding to the Er state.

Further, an S1 state corresponds to a threshold voltage higher than the threshold voltage corresponding to the above Er state. For example, data "1011" may be allocated to the memory cell MC corresponding to the S1 state.

Further, an S2 state corresponds to a threshold voltage higher than the threshold voltage corresponding to the above S1 state. For example, data "0011" may be allocated to the memory cell MC corresponding to the S2 state.

Similarly, an S3 state to an S15 state in the figure correspond to a threshold voltage higher than the threshold voltages corresponding to the S2 state to S14 state. For example, 4-bit data other than the above-mentioned "1111", "1011", and "0011" may be allocated to the memory cells MC corresponding to these distributions.

The number of bits of data to be recorded in the memory cell MC, the number of states, and the allocation of data to each state may be changed as appropriate.

For example, when "1" is allocated to all the fourth bits of the Er state and the S1 state to the S7 state and "0" is allocated to all the fourth bits of the S8 state to the S15 state, a read voltage $V_{CG8R}$ is supplied to the word line WL when reading the data of the fourth bits.

Further, for example, "1" is allocated to all the third bits of the Er state and the S1 state to the S3 state, "0" is allocated to all the third bits of the S4 state to the S11 state, and "1" is allocated to all the third bits of the S12 state to the S15 state, read voltages $V_{CG4R}$ and $V_{CG12R}$ are supplied to the word line WL when reading the data of the third bits.

[Read Operation]

Figure 12:
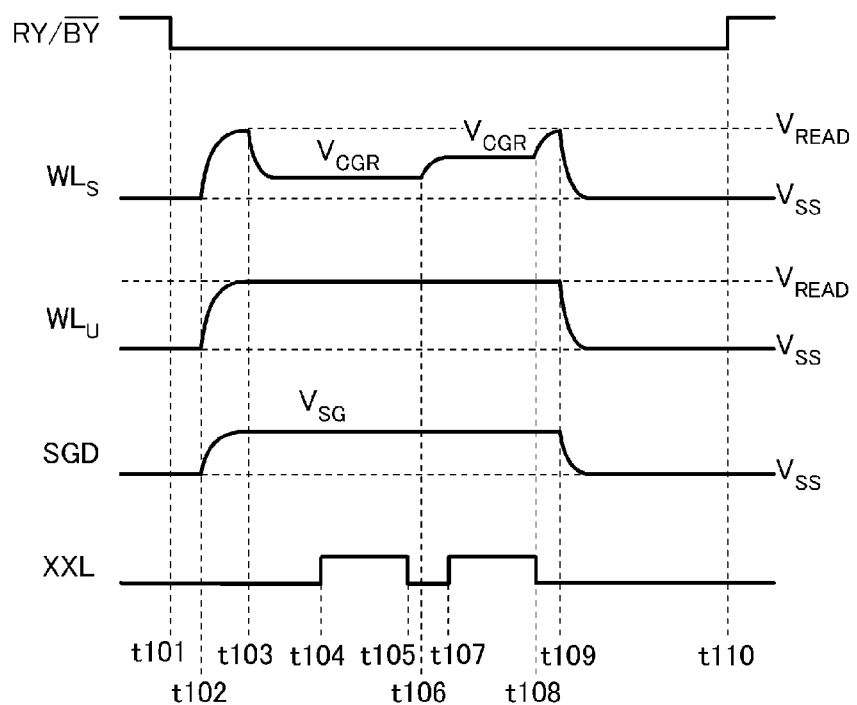
FIG. 12 is a schematic voltage diagram illustrating a read operation.
Figure 13:
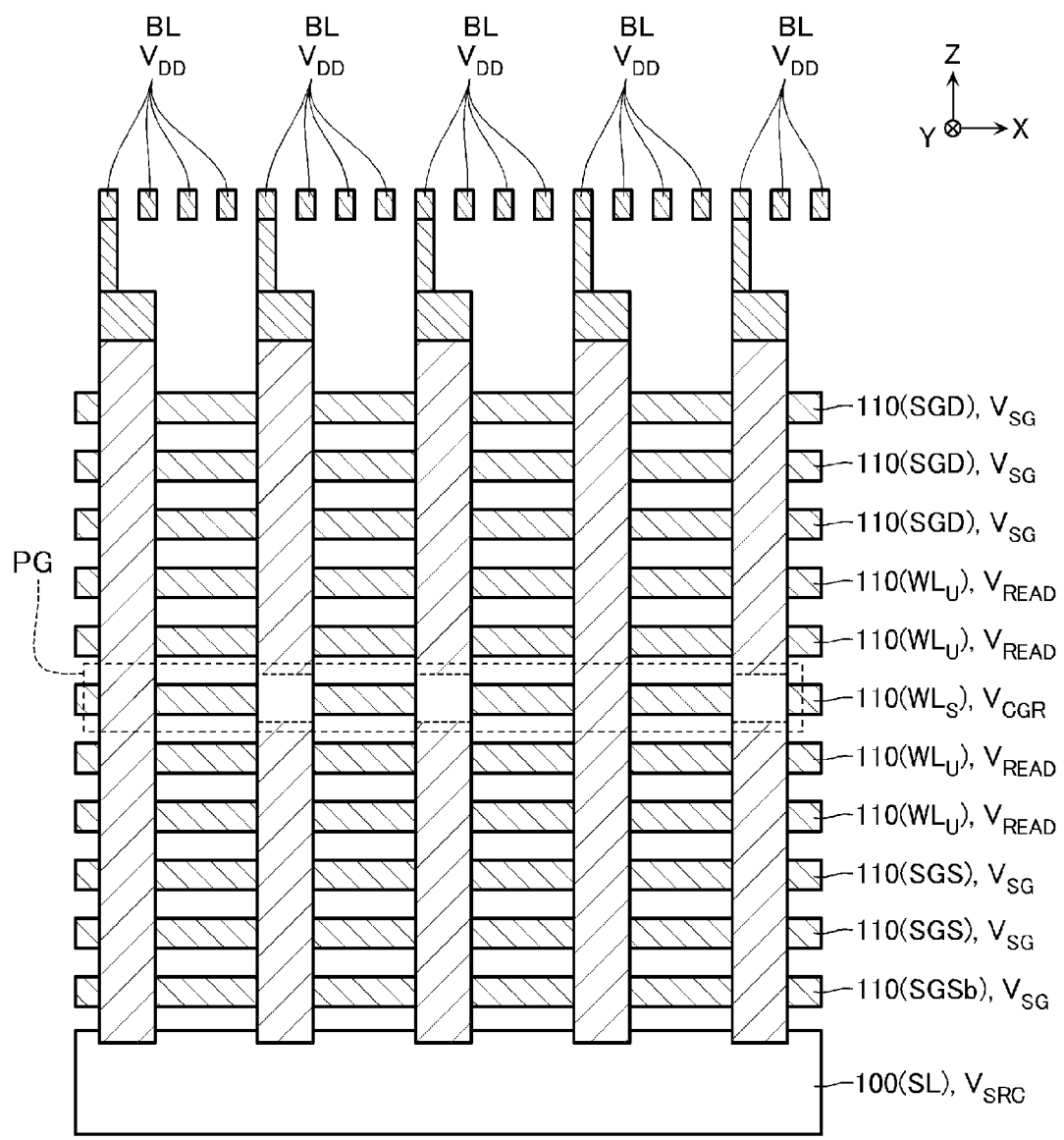
FIG. 13 illustrates a schematic cross-sectional view of memory strings to explain a read operation.

Next, a read operation of the semiconductor storage device according to the present embodiment will be described with reference to FIGS. 12 and 13. FIG. 12 is a schematic voltage diagram of the read operation. FIG. 13 illustrates a schematic cross-sectional view of memory strings to explain the read operation.

In the following description, a word line WL that is the target of operation may be referred to as a selected word line $WL_S$, and other word lines WL may be referred to as unselected word lines $WL_U$. In the following description, an example of executing a read operation for a memory cell MC connected to the selected word line $WL_S$ (hereinafter, may be referred to as a "selected memory cell MC") among a plurality of memory cells MC in a string unit SU that is the target of operation will be described. Further, a configuration including all memory cells MC belonging to one string unit SU and corresponding to the same word line WL may be referred to as a page PG.

When executing the read operation, a command set to execute the read operation is input from the control die CD to the memory die MD. This command set includes command data $D_{CMD}$ for executing the read operation, and address data $D_{ADD}$ for designating a page PG, a memory block BLK, a memory die MD, etc. that are the targets of the read operation.

At time t101 of the read operation, the terminal RY//BY (see FIG. 4) is in an "L" state. Further, at time t101, for example, the bit line BL is charged. For example, "H" is latched in the latch circuit SDL of FIG. 7, and the states of the signal lines STB, XXL, BLC, BLS, HLL, and BLX are set to "L, L, H, H, H, and H", respectively. As a result, the voltage $V_{DD}$ is supplied to the bit line BL and the sense node SEN to start charging these. Further, for example, the voltage $V_{SRC}$ is supplied to the source line SL (see FIG. 5) to start charging these. The voltage $V_{SRC}$ has, for example, substantially the same magnitude as that of the ground voltage $V_{SS}$. The voltage $V_{SRC}$ is larger than, for example, the ground voltage $V_{SS}$ and smaller than the voltage $V_{DD}$.

At time t102 of the read operation, for example, as illustrated in FIG. 12, the read pass voltage $V_{READ}$ is supplied to a selected word line $WL_S$ and an unselected word line $WL_U$ to set all the memory cells MC to an ON state.

Further, a voltage $V_{SG}$ is supplied to the selected gate lines (SGD, SGS, and SGSb) to set the select transistors (STD, STS, and STSb) to an ON state.

At time t103 of the read operation, the read voltage $V_{CGR}$ (any of $V_{CG1R}$ to $V_{CG15R}$) is supplied to the selected word line $WL_S$. As a result, for example, as illustrated in FIG. 13, a part of selected memory cells MC is set to an ON state, and the remaining selected memory cells MC are set to an OFF state.

In time t104 to time t106 of the read operation, for example, as illustrated in FIG. 12, the ON state/OFF state of the selected memory cells MC is detected by the sense amplifier module SAM (see FIG. 6). For example, the wiring LBUS is charged via the charging transistor 55 of FIG. 7. Further, at time t104, the states of the signal lines STB, XXL, BLC, BLS, HLL, and BLX are set to "L, H, H, H, L, and H", respectively, and the charges of the sense node SEN are released to the bit line BL. Here, the voltage of the sense node SEN connected to the bit line BL corresponding to the memory cell MC in the ON state decreases relatively greatly. The voltage of the sense node SEN connected to the bit line BL corresponding to the memory cell MC in the OFF state does not decrease greatly. Further, at time t105, the states of the signal lines STB, XXL, BLC, BLS, HLL, and BLX are set to "H, L, H, H, L, H", respectively, and the charges of the wiring LBUS is released or maintained. Further, the signal line STL is set to an "H" state, and data indicating the state of the selected memory cell MC is latched by any of the latch circuits DL0 to $DLn_L$.

At time t106 to time t108 of the read operation, another read voltage $V_{CGR}$ (any of $V_{CG1R}$ to $V_{CG15R}$) is supplied to the selected word line $WL_S$, the ON state/OFF state of the selected memory cell MC is detected by the sense amplifier module SAM (see FIG. 6), and data indicating the state of the selected memory cell MC is acquired. At this time, the signal line XXL is set to an "H" state at time t107, and the signal line XXL is in an "L" state at time t108.

At time t108 of the read operation, the read pass voltage $V_{READ}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t109 of the read operation, the ground voltage $V_{SS}$ is supplied to the selected word line WLS, the unselected word line $WL_U$, and the selected gate lines (SGD, SGS, and SGSb).

After that, by appropriately executing logical operations such as AND and OR on the data latched by the latch circuits DL0 to $DLn_L$, the data recorded in the memory cell MC are calculated and transferred to the cache memory CM (see FIG. 4).

A case where two read voltages $V_{CGR}$ are supplied to the selected word line $WL_S$ in the read operation is illustrated in the example of FIG. 12. However, the number of read voltages $V_{CGR}$ supplied to the selected word line $WL_S$ in the read operation may be one or three or more.

[Write Sequence]

Figure 14:
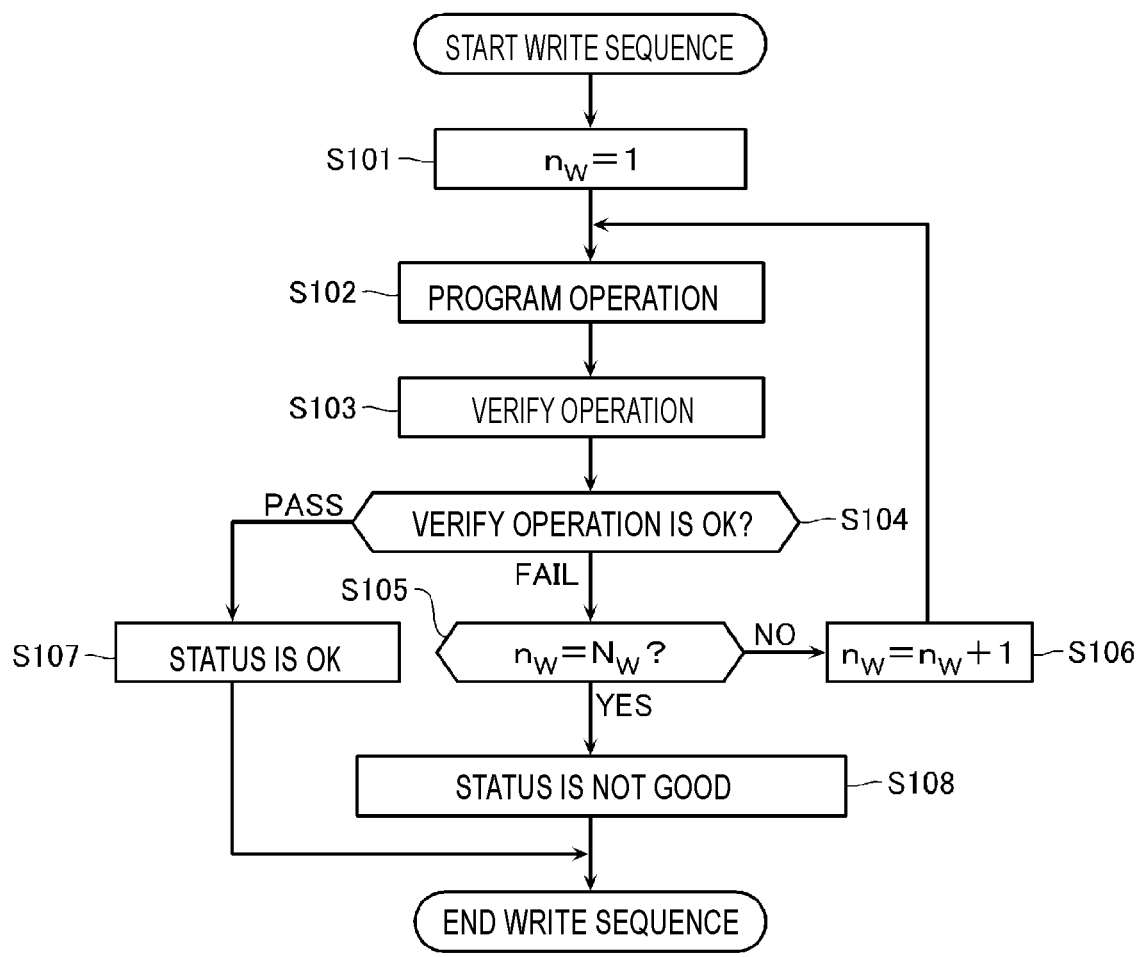
FIG. 14 is a schematic flow chart of a write sequence.
Figure 15:
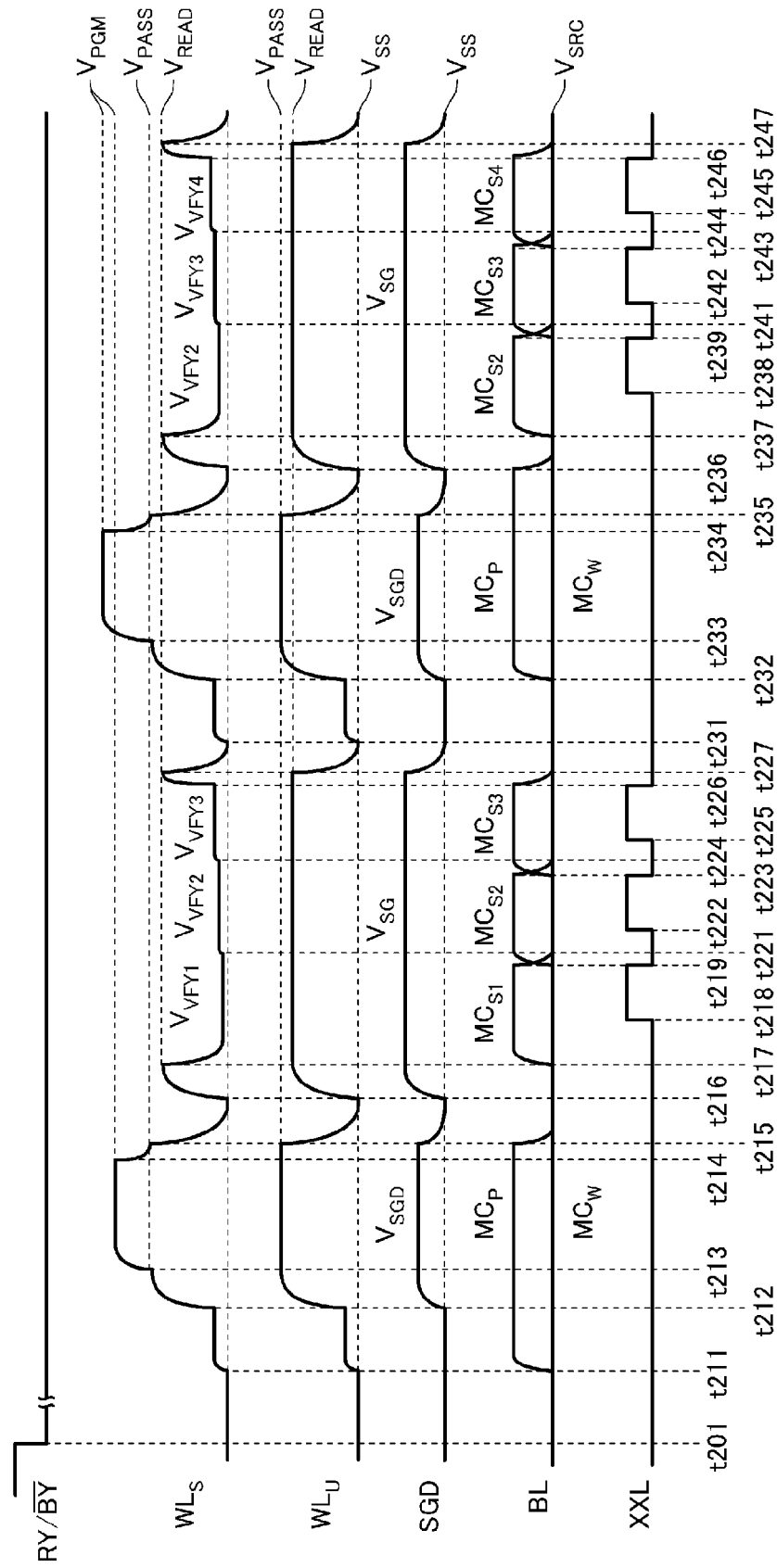
FIG. 15 is a schematic voltage diagram of a write sequence.
Figure 16:
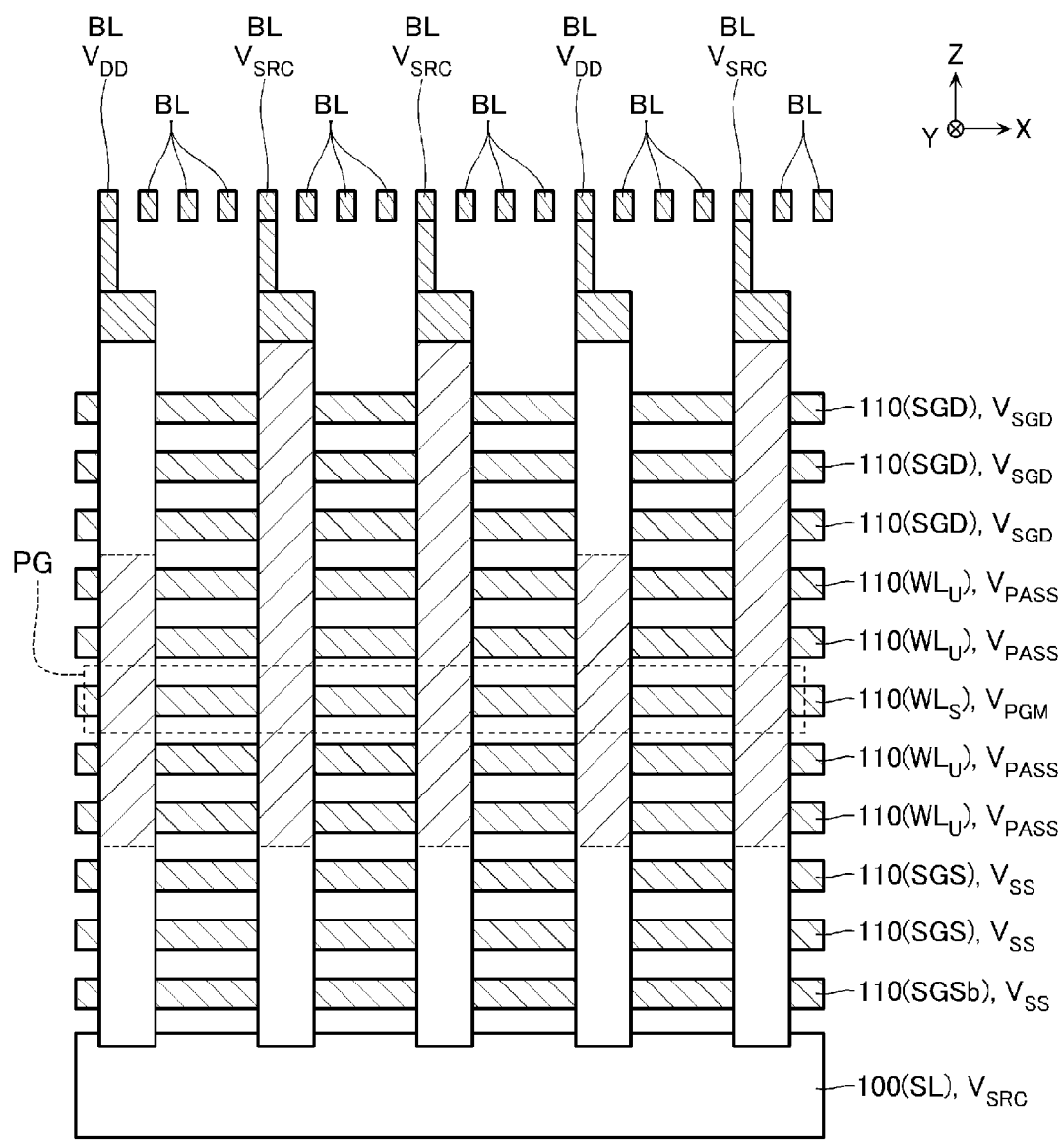
FIG. 16 illustrates a schematic cross-sectional view of memory strings to explain a program operation.
Figure 17:
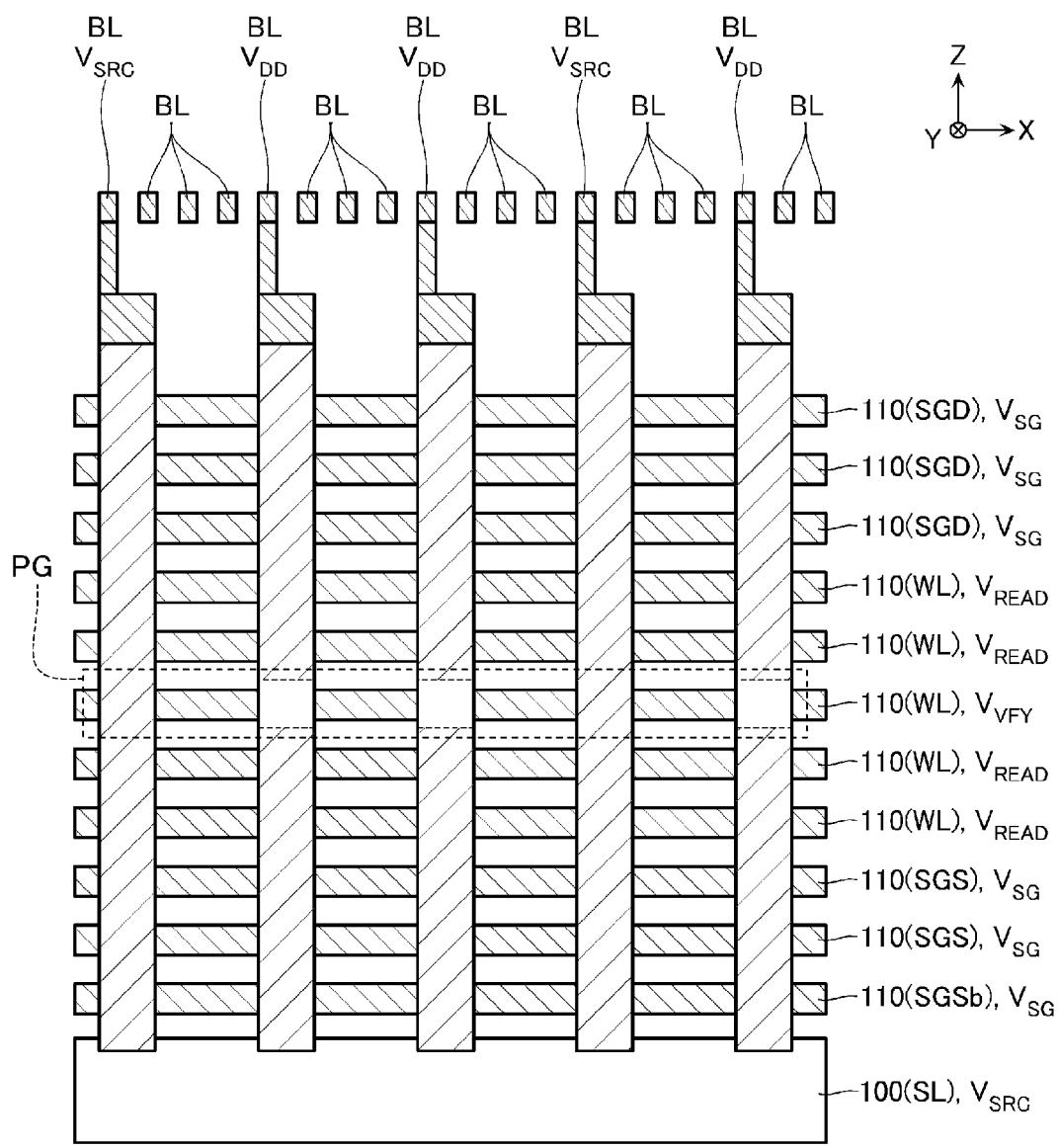
FIG. 17 illustrates a schematic cross-sectional view of memory strings to explain a verify operation.

Next, a write sequence of the semiconductor storage device will be described with reference to FIGS. 14 to 17. FIG. 14 is a schematic flow chart of the write sequence. FIG. 15 is a schematic voltage diagram of the write sequence. FIG. 16 illustrates a schematic cross-sectional view of memory strings to explain a program operation in the write sequence. FIG. 17 is a schematic cross-sectional view of memory strings to explain a verify operation in the write sequence.

When executing the write sequence, a command set to execute the write sequence is input from the control die CD to the memory die MD. This command set includes command data $D_{CMD}$ for executing the write sequence, address data $D_{ADD}$ for designating a page PG, a memory block BLK, a memory die MD, etc. that is the target of the write sequence, and data DAT that is written in a memory cell MC in the page PG. Along with this, at time t201, the terminal RY//BY is set to an "L" state (see FIG. 15).

In step S101 (see FIG. 14), the number of loops $n_W$ is set to 1. The number of loops $n_W$ is recorded in a register. Further, in this step, the data of the number of bit lines BL×4 bits recorded in the selected memory cell MC in the write sequence are latched by the latch circuits DL0 to DLn$_L$.

In step S102, the program operation is performed.

At time t211 of the program operation (see FIG. 15), for example, the voltage $V_{SRC}$ is supplied to a bit line BL connected to a selected memory cell MC whose threshold voltage is adjusted (hereinafter, may be referred to as a "write memory cell $MC_W$"), among a plurality of selected memory cells MC, and the voltage $V_{DD}$ is supplied to a bit line BL connected to a selected memory cell MC whose threshold voltage is not adjusted (hereinafter, may be referred to as a "inhibited memory cell $MC_P$"), among the plurality of selected memory cells MC. For example, "L" is latched in a latch circuit SDL (see FIG. 7) corresponding to the write memory cell $MC_W$, and "H" is latched in a latch circuit SDL (see FIG. 7) corresponding to the inhibited memory cell $MC_P$. Further, the states of the signal lines STB, XXL, BLC, BLS, HLL, and BLX are set to "L, L, H, H, L, and H", respectively.

At time t212 of the program operation (see FIG. 15), the write memory cell $MC_W$ is selectively conducted with the bit line BL. For example, a voltage $V_{SGD}$ is supplied to the drain side selected gate line SGD. The voltage $V_{SGD}$ is smaller than, for example, the voltage $V_{SG}$ in FIG. 15. As a result, a drain side select transistor STD corresponding to the bit line BL to which the voltage $V_{SRC}$ is supplied is set to an ON state, and a drain side select transistor STD corresponding to the bit line BL to which the voltage $V_{DD}$ is supplied is set to an OFF state.

Further, at time t212 of the program operation, a write pass voltage $V_{PASS}$ is supplied to the selected word line $WL_S$ and the unselected word line $WL_U$ to set all the memory cells MC to an ON state. The write pass voltage $V_{PASS}$ is larger than, for example, the read pass voltage $V_{READ}$ in FIG. 12.

At time t213 of the program operation, a program voltage $V_PGM$ is supplied to the selected word line $WL_S$. The program voltage $V_PGM$ is larger than the write pass voltage $V_{PASS}$. Here, for example, as illustrated in FIG. 16, the voltage $V_{SRC}$ is supplied to the channel of the semiconductor layer 120 corresponding to the write memory cell $MC_W$. For that reason, at a position corresponding to the write memory cell $MC_W$, a relatively large electric field is generated between the channel of the semiconductor layer 120 and the selected word line $WL_S$, and electrons in the channel of the semiconductor layer 120 are tunneled into the charge storage film 132 (see FIG. 10) via the tunnel insulating film 131 (see FIG. 10) to increase the threshold voltage of the memory cell MC. The channel of the semiconductor layer 120 corresponding to the inhibited memory cell $MC_P$ is electrically in a floating state, and the potential of this channel becomes a voltage of about the write pass voltage $V_{PASS}$ due to capacitive coupling with the unselected word line $WL_U$. Therefore, at a position corresponding to the inhibited memory cell $MC_P$, an electric field generated between the channel of the semiconductor layer 120 and the selected word line $WL_S$ is relatively small, so that the threshold voltage of the memory cell MC does not increase.

At time t214 of the program operation, the write pass voltage $V_{PASS}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t215 of the program operation, the ground voltage $V_{SS}$ is supplied to the selected word line $WL_S$, the unselected word line $WL_U$, and the selected gate lines (SGD, SGS, and SGSb).

In step S103 (see FIG. 14), a verify operation is performed.

At time t216 of the verify operation, for example, as illustrated in FIG. 15, the read pass voltage $V_{READ}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t217 of the verify operation, a predetermined verify voltage (the verify voltage $V_{VFY1}$ in the example of FIG. 15) is supplied to the selected word line $WL_S$. As a result, for example, as illustrated in FIG. 17, a part of selected memory cells MC are set to an ON state, and the remaining selected memory cells MC are set to an OFF state.

Further, at time t217, for example, the bit line BL is charged. At this time, for example, based on the data in the latch circuits DL0 to DLn$_L$, the voltage $V_{DD}$ is supplied to a bit line BL connected to the write memory cell $MC_W$ corresponding to a specific state (S1 state in the example of FIG. 15) (hereinafter, may be referred to as a "memory cell $MC_{S1}$"), and the voltage $V_{SRC}$ is supplied to the other bit lines BL.

At time t218 to time t219 of the verify operation, for example, as illustrated in FIG. 15, the ON state/OFF state of the memory cell $MC_{S1}$ is detected by the sense amplifier module SAM (see FIG. 6), and data indicating the state of the memory cell $MC_{S1}$ is acquired. At this time, the data latched by the latch circuits DL0 to DLn$_L$ may be updated.

At time t219 of the verify operation, for example, the bit line BL is charged. At this time, for example, based on the data in the latch circuits DL0 to DLn$_L$, the voltage $V_{DD}$ is supplied to a bit line BL connected to the write memory cell $MC_W$ corresponding to a specific state (S2 state in the example of FIG. 15) (hereinafter, may be referred to as a "memory cell $MC_{S2}$"), and the voltage $V_{SRC}$ is supplied to the other bit lines BL.

At time t221 of the verify operation, a predetermined verify voltage (the verify voltage $V_{VFY2}$ in the example of FIG. 15) is supplied to the selected word line $WL_S$.

At time t222 to time t223 of the verify operation, for example, as illustrated in FIG. 15, the ON state/OFF state of the memory cell $MC_{S2}$ is detected by the sense amplifier module SAM (see FIG. 6), and data indicating the state of the memory cell $MC_{S2}$ is acquired. At this time, the data latched by the latch circuits DL0 to DLn$_L$ may be updated.

At time t223 of the verify operation, for example, the bit line BL is charged. At this time, for example, based on the data in the latch circuits DL0 to DLn$_L$, the voltage $V_{DD}$ is supplied to a bit line BL connected to the write memory cell $MC_W$ corresponding to a specific state (S3 state in the example of FIG. 15) (hereinafter, may be referred to as a "memory cell $MC_{S3}$"), and the voltage $V_{SRC}$ is supplied to the other bit lines BL.

At time t224 of the verify operation, a predetermined verify voltage (the verify voltage $V_{VFY3}$ in the example of FIG. 15) is supplied to the selected word line $WL_S$.

At time t225 to time t226 of the verify operation, for example, as illustrated in FIG. 15, the ON state/OFF state of the memory cell $MC_{S3}$ is detected by the sense amplifier module SAM (see FIG. 6), and data indicating the state of the memory cell $MC_{S3}$ is acquired. At this time, the data latched by the latch circuits DL0 to $DLn_L$ may be updated.

At time t226 of the verify operation, the voltage $V_{SRC}$ is supplied to all the bit lines BL.

Further, at time t226, the read pass voltage $V_{READ}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t227 of the verify operation, the ground voltage $V_{SS}$ is supplied to the selected word line $WL_S$, the unselected word line $WL_U$, and the selected gate lines (SGD, SGS, and SGSb).

After that, the data latched by the latch circuit SDL are transferred to a counter circuit or the like which counts the number of memory cells MC whose threshold voltage has reached a target value or the number of memory cells MC whose threshold voltage has not reached the target value.

The example of FIG. 15 illustrates a case where three verify voltages $V_{VFY}$ are supplied to the selected word line $WL_S$ in the verify operation. However, the number of verify voltages $V_{VFY}$ supplied to the selected word line $WL_S$ in the verify operation may be two or less, four or more, or may change according to the number of loops $n_W$.

In step S104 (see FIG. 14), the result of the verify operation is determined. For example, by referring to the counter circuit, if the number of memory cells MC whose threshold voltage has not reached the target value is a certain number or more, it is determined as verify FAIL, and the process proceeds to step S105. However, if the number of memory cells MC whose threshold voltage has not reached the target value is a certain number or less, it is determined as verify PASS, and the process proceeds to step S107.

In step S105, it is determined whether the number of loops $n_W$ has reached a predetermined number of times $N_W$. When it is determined the number of loops $n_W$ has not been reached, the process proceeds to step S106. When it is determined the number of loops $n_W$ has been reached, the process proceeds to step S108.

In step S106, 1 is added to the number of loops $n_W$, and the process proceeds to step S102. Therefore, as illustrated in FIG. 15, the operations corresponding to time t211 to time t227 are executed from time t231 to time t247. Further, in step S106, for example, a predetermined voltage $\Delta V$ is added to the program voltage $V_PGM$. Therefore, as illustrated in FIG. 15, the program voltage $V_PGM$ increases as the number of loops $n_W$ increases.

In step S107, the status data $D_{ST}$ indicating that the write sequence has been completed normally is stored in the status register STR (see FIG. 4), and the write sequence is terminated. The status data $D_{ST}$ is output to the control die CD (see FIG. 1) by a status read operation.

In step S108, the status data $D_{ST}$ indicating that the write sequence has not been completed normally is stored in the status register STR (see FIG. 2), and the write sequence is terminated.

[Full Sequence Write]

Next, full sequence write will be described with reference to FIGS. 18 and 19. The full sequence write is an aspect of the write sequence described with reference to FIGS. 14 to 17.

As illustrated in FIG. 18, the full sequence write is executed sequentially for a plurality of pages PG0 to $PGm_P$ ($m_P$ is a natural number) in a memory block BLK. Among a plurality of word lines WL, the one located at the lowermost position may correspond to a page PG0, and the one located at the uppermost position may correspond to a page $PGm_P$. Further, among the plurality of word lines WL, the one located at the uppermost position may correspond to the page PG0, and the one located at the lowermost position may correspond to the page $PGm_P$.

Figure 19:
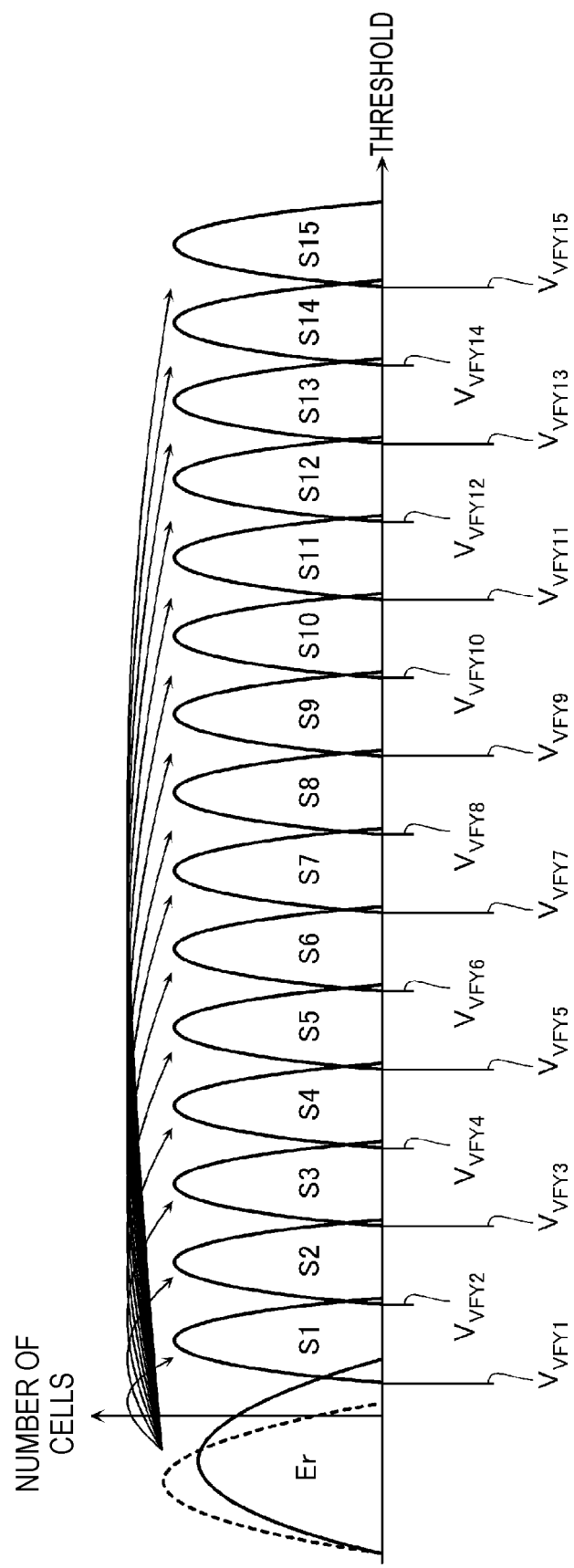
FIG. 19 is a schematic histogram of threshold voltages to explain a full sequence write.

As illustrated in FIG. 19, the full sequence write is executed for a page PG in an erase state (a page PG in which all the belonging memory cells MC are in the Er state). In the full sequence write, as illustrated in FIG. 19, the memory cells MC in the page PG are controlled from the Er state and the S1 state to the S15 state by one write sequence.

[Interference Between Adjacent Word Lines]

Figure 20:
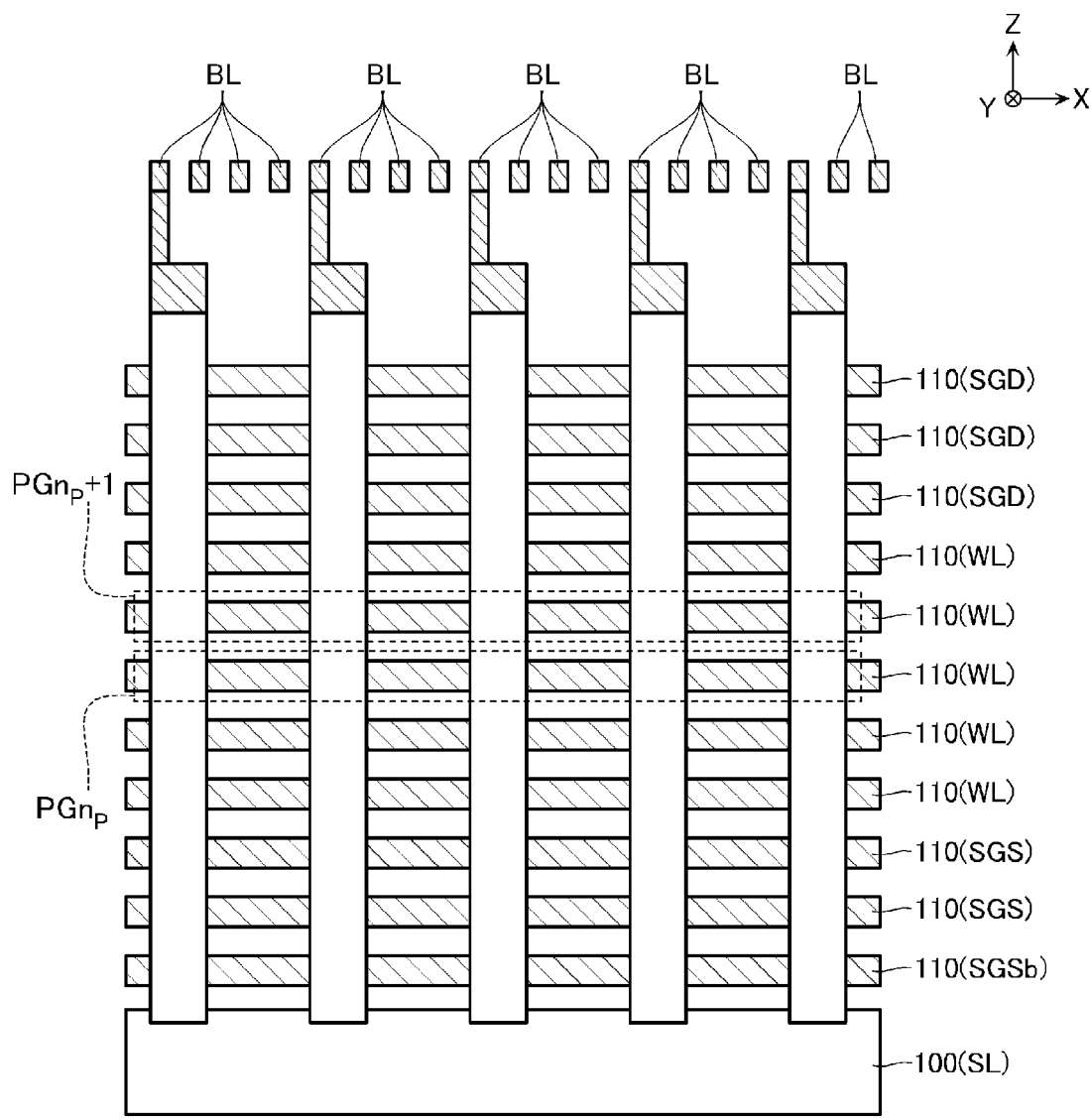
FIG. 20 illustrates a schematic cross-sectional view of memory strings to explain interference between adjacent word lines.

For example, when the full sequence write is executed for a plurality of memory cells MC in a page $PGn_P$ ($n_P$ is a natural number) illustrated in FIG. 20, the threshold values of the memory cells MC in the page $PGn_P$ are controlled to belong any of 16 threshold voltage distributions, as illustrated in FIG. 19.

Figure 21:
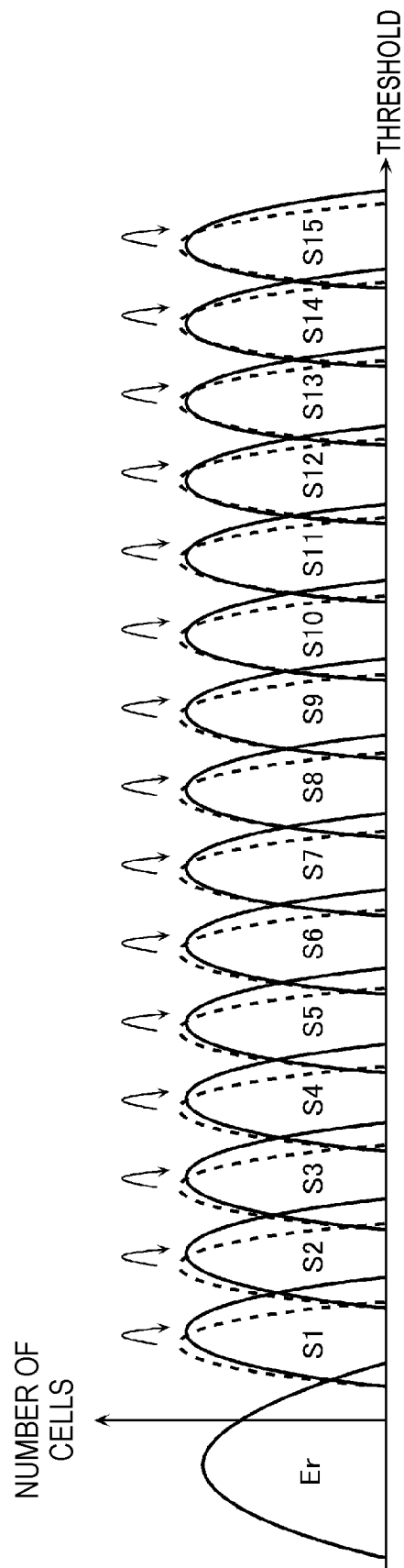
FIG. 21 is a schematic histogram of threshold voltages to explain interference between adjacent word lines.

Next, for example, when the full sequence write is executed for a plurality of memory cells MC in a page $PGn_{P+1}$ illustrated in FIG. 20, 16 threshold voltage distributions of the memory cells MC in the page $PGn_P$ may spread, as illustrated in FIG. 21. It may be considered that this is because, for example, charges are accumulated in a portion of the charge storage film 132 described with reference to FIG. 10, which is located between a word line WL corresponding to the page $PGn_P$ and a word line WL corresponding to the page $PGn_{P+1}$. Hereinafter, such an effect is referred to as "interference between adjacent word lines".

As illustrated in FIG. 21, the influence of the interference between adjacent word lines appears more strongly in a memory cell MC in a state corresponding to a lower threshold voltage. Further, the influence of the interference between adjacent word lines appears more strongly when a memory cell MC in the page $PGn_{P+1}$ is a memory cell MC in a state corresponding to a higher threshold voltage.

[Foggy Fine Write]

Next, foggy fine write will be described with reference to FIGS. 22 to 24. In the foggy fine write, foggy write and fine write are executed. These foggy write and fine write are one aspect of the write sequence described with reference to FIGS. 14 to 17.

As illustrated in FIG. 22, the foggy write and the fine write are executed in the following order. First, the foggy write is executed for a page PG0. Next, the foggy write is executed for a page PG1, and the fine write is executed for the page PG0. Next, the foggy write is executed for a page PG2, and the fine write is executed for the page PG1. Similarly, the foggy write for a page $PGn_P$ is executed as the $2n_F$th ($n_F$ is a natural number) write sequence, and the fine write for a page $PGn_P-1$ is executed as the $2n_F+1$st write sequence.

Figure 23:
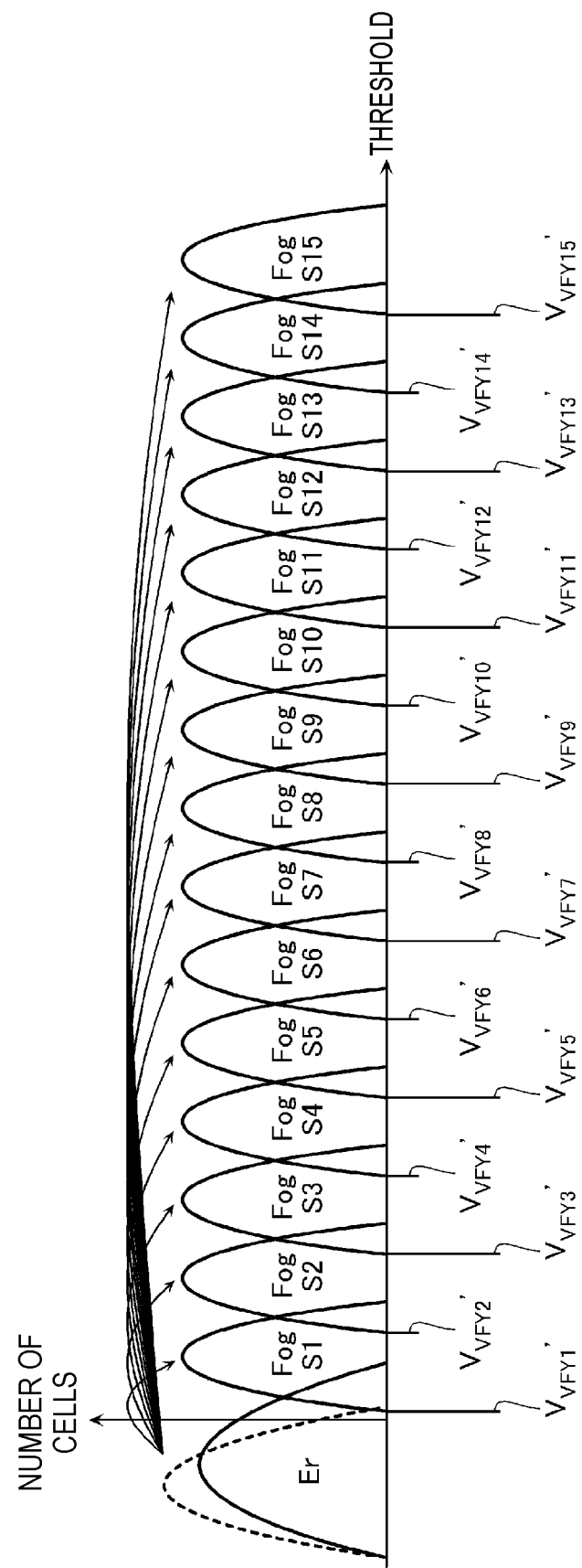
FIG. 23 is a schematic histogram of threshold voltages to explain a foggy write.

As illustrated in FIG. 23, the foggy write is executed for the page PG in an erase state. In the foggy write, as illustrated in FIG. 23, the threshold voltage of the memory cell MC in the page PG is controlled to a threshold voltage corresponding to a FogS1 state to a FogS15 state by one write sequence.

The foggy write is for the most part executed by the method described with reference to FIGS. 14 to 17. However, a verify voltage $V_{VFY1}'$ to a verify voltage $V_{VFY15}'$ used in the foggy write are smaller than the verify voltage $V_{VFY1}$ to the verify voltage $V_{VFY15}$ used in the full sequence write.

As illustrated in FIG. 22, when the foggy write has already been executed for a page $PGn_P$ and a page $PGn_P+1$, the fine write is executed for the page $PGn_P$. In the fine write, as illustrated in FIG. 24, the memory cells MC in the FogS1 state to the FogS15 state in the page $PGn_P$ are controlled from the S1 state to the S15 state, respectively.

Here, after the foggy write is executed for a plurality of memory cells MC in the page $PGn_P$ and before the fine write is executed for the plurality of memory cells MC in the page $PGn_P$, the foggy write is executed for a plurality of memory cells MC in the page $PGn_P+1$. As a result, the threshold voltage distributions of the plurality of memory cells MC in the page $PGn_P$ spread due to the influence of the interference between adjacent word lines. Such spread of the threshold voltage distributions may be suitably corrected by executing the fine write for the plurality of memory cells MC in the page $PGn_P$.

Further, after the fine write is executed for the plurality of memory cells MC in the page $PGn_P$, the fine write is also executed for a plurality of memory cells MC in the page $PGn_P+1$. As a result, the threshold voltage distributions of the plurality of memory cells MC in the page $PGn_P$ spread due to the influence of the interference between adjacent word lines. However, as illustrated in FIG. 24, the amount of charges of each memory cell controlled by the fine write is smaller than that of the full sequence write described with reference to FIG. 19. Therefore, the influence of the interference between adjacent word lines may be significantly reduced as compared with the full sequence write.

Here, as described above, the influence of the interference between adjacent word lines appears more strongly when the memory cell MC in the page $PGn_P+1$ is a memory cell MC in a state corresponding to a higher threshold voltage. Therefore, in the fine operation according to the present embodiment, the plurality of memory cells MC corresponding to the S1 state to the S15 state are classified into two types: one having a larger interference between adjacent word lines, and the other having a smaller interference between adjacent word lines. As a result, the plurality of memory cells MC corresponding to the S1 state to the S15 state are classified into a total of 30 types. Further, the threshold voltage of the memory cell MC having the larger interference between adjacent word lines is controlled to be small in advance. As a result, even for a memory cell MC in which a fluctuation of the threshold voltage caused by the fine write for the page $PGn_P+1$ is relatively large, it is possible to cancel out the fluctuation of the threshold voltage so that multi-bit data may be suitably recorded in the memory cells MC. This makes it possible to provide a highly reliable semiconductor storage device.

Figure 24:
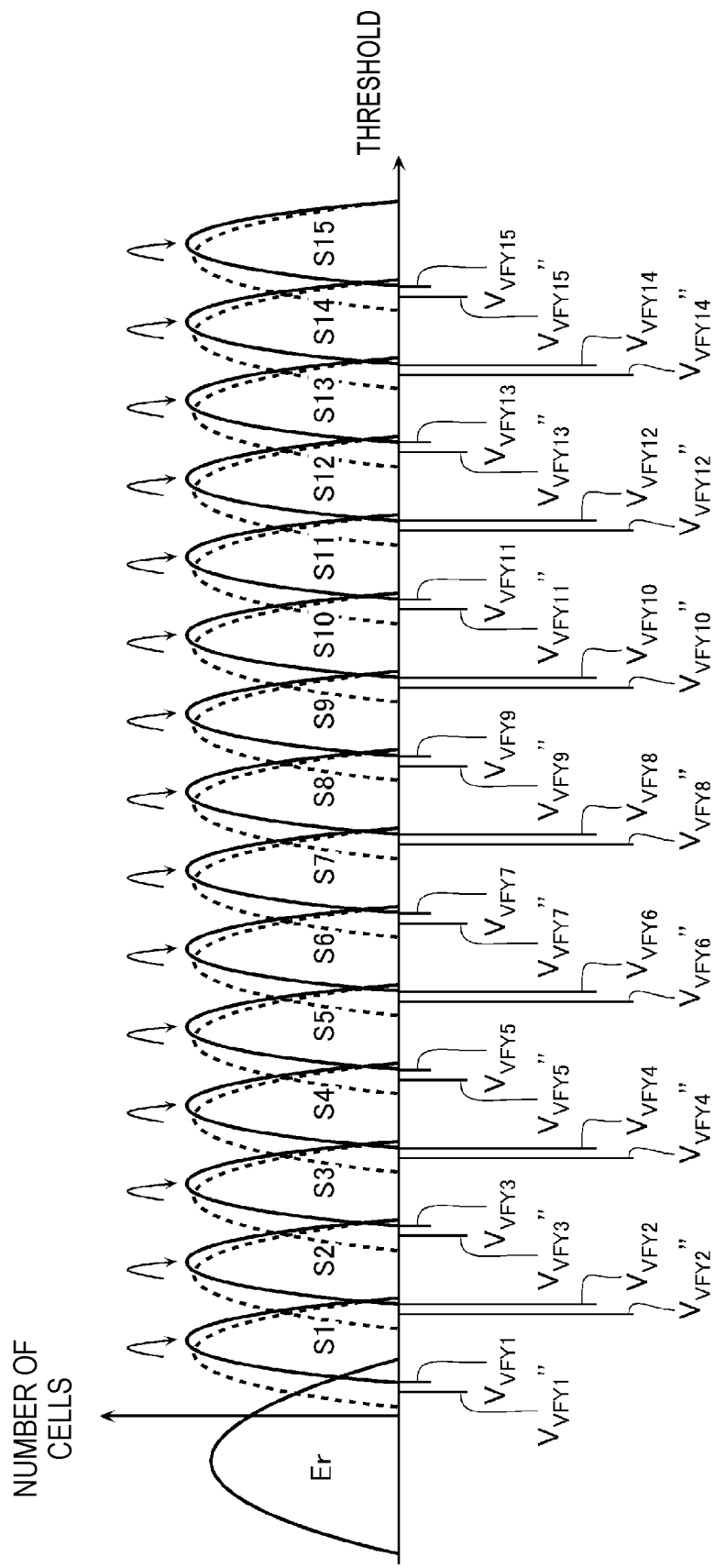
FIG. 24 is a schematic histogram of threshold voltages to explain a fine write.

For example, in the fine write according to the present embodiment, as illustrated in FIG. 24, two types of verify voltages $V_{VFY1}''$ to $V_{VFY15}''$ and $V_{VFY1}$ to $V_{VFY15}$ may be used for the write memory cells $MC_W$ corresponding to the S1 state to the S15 state, respectively. The verify voltages $V_{VFY1}''$ to $V_{VFY15}''$ are larger than the verify voltages $V_{VFY1}'$ to $V_{VFY15}'$ used in the foggy write, respectively, and smaller than the verify voltages $V_{VFY1}$ to $V_{VFY15}$ used in the full sequence write, respectively.

Further, in the fine write according to the present embodiment, among the plurality of memory cells MC in the page $PGn_P$, for those adjacent to a memory cell MC corresponding to the Er state or one of the S1 state to the S7 state in the page $PGn_P+1$ in the Z direction, determination on the ON state/OFF state in which the verify voltages $V_{VFY1}$ to $V_{VFY15}$ are used may be made in the verify operation. Among the plurality of memory cells MC in the page $PGn_P$, for those adjacent to a memory cell MC corresponding to one of the S8 state to the S15 state in the page $PGn_P+1$ in the Z direction, determination on the ON state/OFF state in which the verify voltages $V_{VFY1}''$ to $V_{VFY15}''$ are used may be made in the verify operation.

[Write Sequence in Fine Write]

Figure 25:
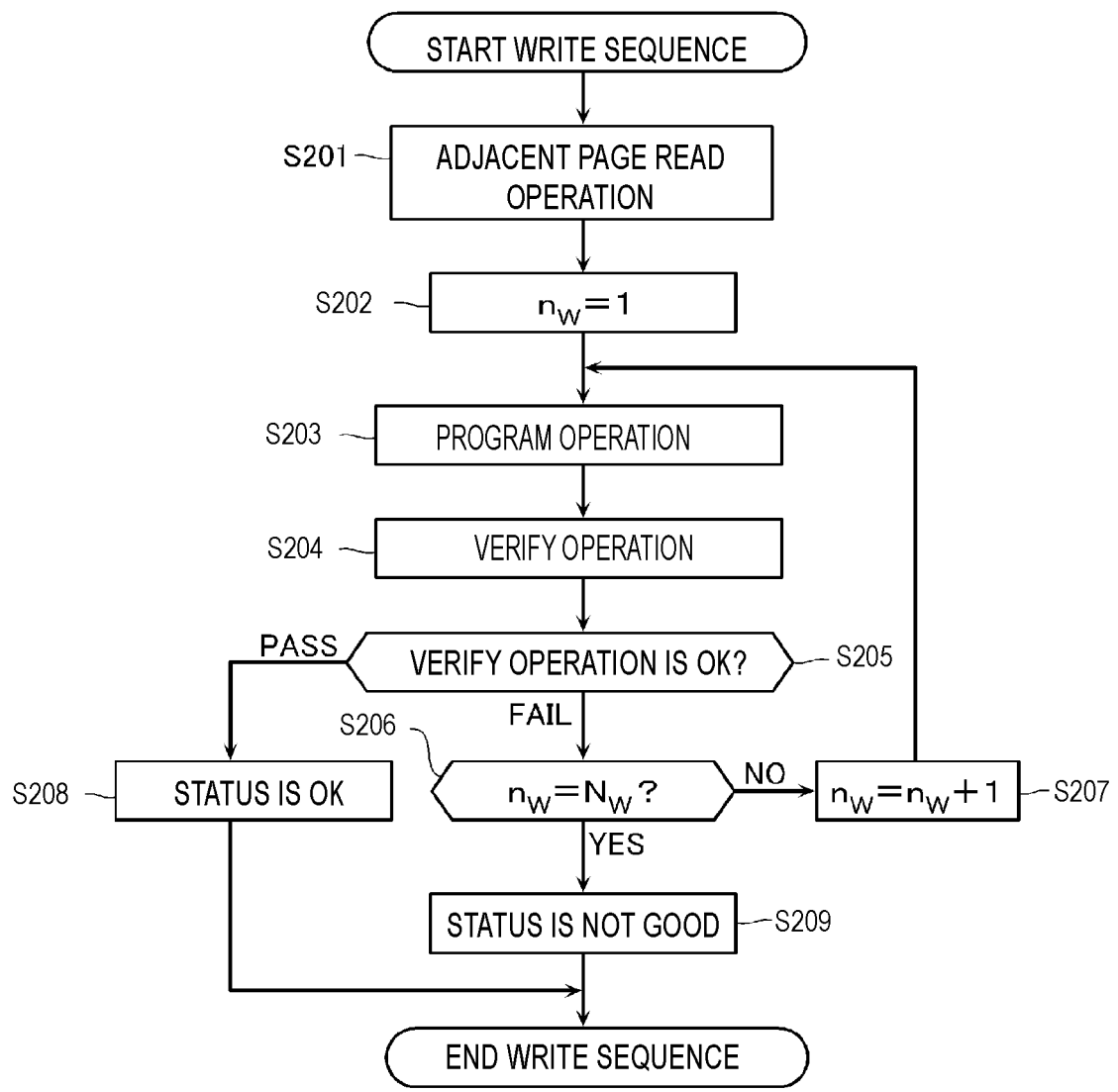
FIG. 25 is a schematic flow chart of a write sequence corresponding to the fine write according to the first embodiment.
Figure 26:
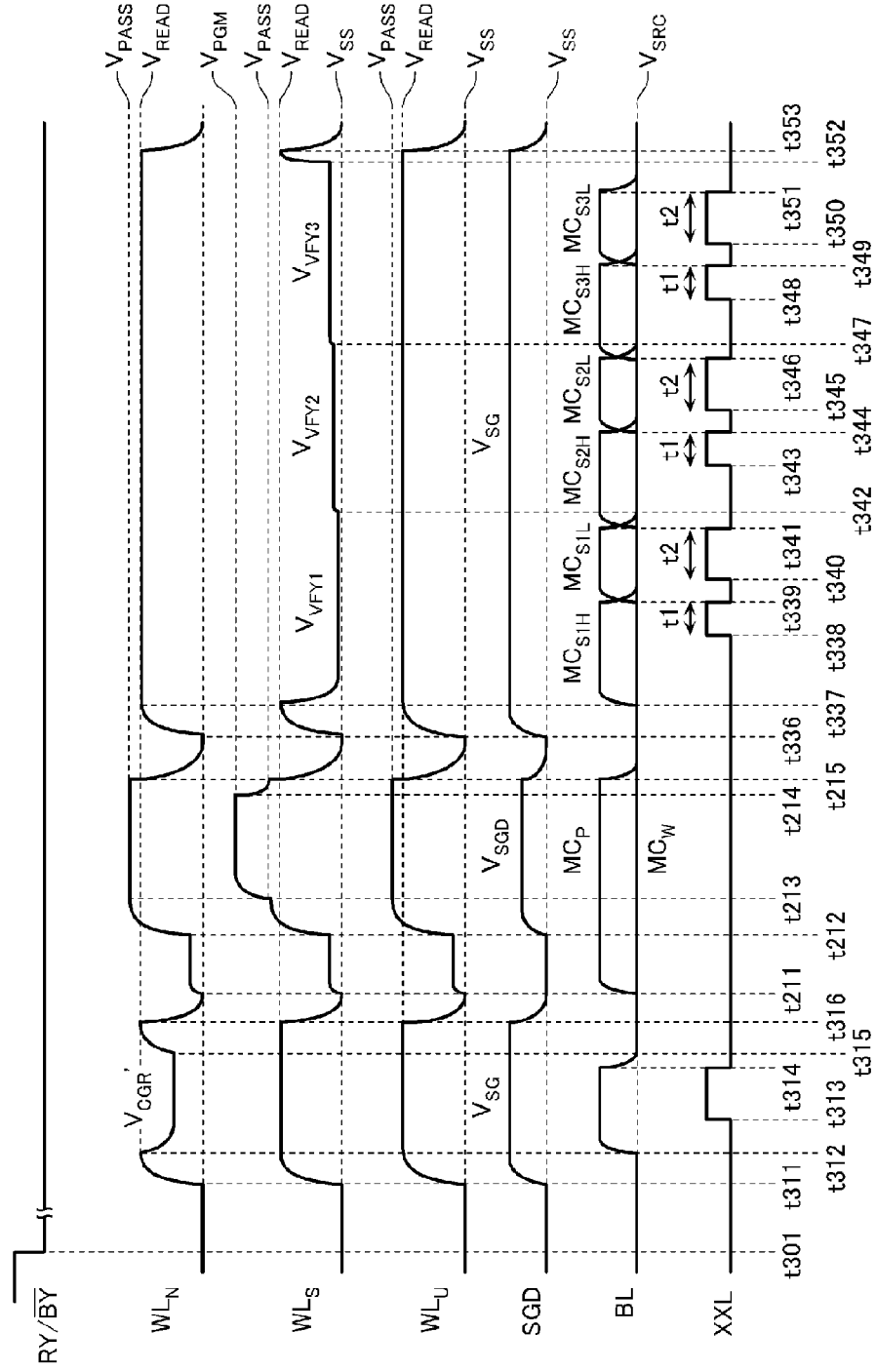
FIG. 26 is a schematic voltage diagram of the same write sequence.

Next, a write sequence corresponding to the fine write according to the present embodiment will be described with reference to FIGS. 25 and 26. FIG. 25 is a schematic flow chart of the write sequence. FIG. 26 is a schematic voltage diagram of the write sequence.

When executing the write sequence, a command set to execute the write sequence is input from the control die CD to the memory die MD. This command set includes command data $D_{CMD}$ for executing the write sequence, address data $D_{ADD}$ for designating a page PG, a memory block BLK, a memory die MD, etc. that are the target of the write sequence, and data DAT that is written in a memory cell MC in the page PG. Along with this, at time t301, the terminal RY//BY is set to an "L" state (see FIG. 26).

In step S201, an adjacent page read operation is performed.

At time t311 of the adjacent page read operation, the read pass voltage $V_{READ}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t312 of the adjacent page read operation, a read voltage $V_{CGR}'$ is supplied to an unselected word line $WL_U$ adjacent to the selected word line $WL_S$ (hereinafter, referred as an "adjacent word line $WL_N$"), in which the write sequence is executed after the selected word line $WL_S$. The read voltage $V_{CGR}'$ may be, for example, substantially the same magnitude as the verify voltage $V_{VFY8}'$ in FIG. 23. In such a case, among a plurality of memory cells MC corresponding to the adjacent word line $WL_N$ (hereinafter, referred to as "adjacent memory cells MC"), those corresponding to the Er state and the FogS1 state to the FogS7 state are set to an ON state, and those corresponding to the FogS8 state to the FogS15 state are set to an OFF state.

The magnitude of the read voltage $V_{CGR}'$ may be adjusted as appropriate. For example, the magnitude of the read voltage $V_{CGR}'$ may be set to any other voltage among the verify voltages $V_{VFY1}'$ to $V_{VFY15}'$.

At time t313 to time t314 of the adjacent page read operation, the ON state/OFF state of the adjacent memory cell MC is detected by the sense amplifier module SAM (see FIG. 6), and data indicating the state of the adjacent memory cell MC is acquired. This data is latched in one of the latch circuits DL0 to $DLn_L$.

At time t315 of the adjacent page read operation, the read pass voltage $V_{READ}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t316 of the adjacent page read operation, the ground voltage $V_{SS}$ is supplied to the selected word line $WL_S$, the unselected word line $WL_U$, and the selected gate lines (SGD, SGS, and SGSb).

In step S202 (see FIG. 25), the number of loops $n_W$ is set to 1. Further, in this step, the data of the number of bit lines BL×4 bits recorded in the selected memory cell MC in the write sequence are latched by the latch circuits DL0 to $DLn_L$.

In step S203, a program operation is performed. The program operation is executed in the same manner as the program operation described with reference to FIGS. 14 to 17.

In step S204 (see FIG. 25), a verify operation is performed.

At time t336 of the verify operation, the read pass voltage $V_{READ}$ is supplied to the selected word line $WL_S$ and the unselected word line $WL_U$ to set all the memory cells MC to an ON state. Further, the voltage $V_{SG}$ is supplied to the selected gate lines (SGD, SGS, and SGSb) to set the select transistors (STD, STS, and STSb) to an ON state.

At time t337 of the verify operation, a predetermined verify voltage (the verify voltage $V_{VFY1}$ in the example of FIG. 26) is supplied to the selected word line $WL_S$.

Further, at time t337, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 26, among a plurality of memory cells $MC_{S1}$ corresponding to the S1 state, a memory cell $MC_{S1}$ adjacent to the adjacent memory cell MC determined to be in an OFF state in step S201 (hereinafter, may be referred to as a "memory cell $MC_{S1H}$") is selected.

At time t338 to time t339 of the verify operation, the ON state/OFF state of the memory cell $MC_{S1H}$ is detected by the sense amplifier module SAM (see FIG. 6), and data indicating the state of the memory cell $MC_{S1H}$ is acquired. At this time, the signal line XXL is set to an "H" state at time t338, and the signal line XXL is set to an "L" state at time t339.

Time period t1 between time t338 and time t339 is shorter than time period t2 between time t340 and time t341. Therefore, the charges emitted from the sense node SEN (see FIG. 7) at time t338 to time t339 are fewer than the charges emitted from the sense node SEN (see FIG. 7) at time t340 to time t341. According to such a method, it is possible to execute both the verify operation by the verify voltage $V_{VFY}$ and the verify operation by the verify voltage $V_{VFY}'$ (see FIG. 15) without changing a voltage supplied to the selected word line $WL_S$.

At time t339 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 26, among the plurality of memory cells $MC_{S1}$ corresponding to the S1 state, a memory cell $MC_{S1}$ adjacent to the adjacent memory cell MC determined to be in an ON state in step S201 (hereinafter, may be referred to as a "memory cell $MC_{S1L}$") is selected.

At time t340 to time t341 of the verify operation, the ON state/OFF state of the memory cell $MC_{S1L}$ is detected by the sense amplifier module SAM (see FIG. 6), and data indicating the state of the memory cell $MC_{S1L}$ is acquired. At this time, the signal line XXL is set to an "H" state at time t340, and the signal line XXL is set to an "L" state at time t341.

At time t341 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 26, among a plurality of memory cells $MC_{S2}$ corresponding to the S2 state, a memory cell $MC_{S2}$ adjacent to the adjacent memory cell MC determined to be in the OFF state in step S201 (hereinafter, may be referred to as a "memory cell $MC_{S2H}$") is selected.

At time t342 of the verify operation, a predetermined verify voltage (the verify voltage $V_{VFY2}$ in the example of FIG. 26) is supplied to the selected word line $WL_S$.

At time t343 to time t344 of the verify operation, the ON state/OFF state of the memory cell $MC_{S2H}$ is detected by the sense amplifier module SAM (see FIG. 6), and data indicating the state of the memory cell $MC_{S2H}$ is acquired. At this time, the signal line XXL is set to an "H" state at time t343, and the signal line XXL is set to an "L" state at time t344.

Time period t1 between time t343 and time t344 is shorter than time period t2 between time t345 and time t346.

At time t344 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 26, among the plurality of memory cells $MC_{S2}$ corresponding to the S2 state, a memory cell $MC_{S2}$ adjacent to the adjacent memory cell MC determined to be in the ON state in step S201 (hereinafter, may be referred to as a "memory cell $MC_{S2L}$") is selected.

At time t345 to time t346 of the verify operation, the ON state/OFF state of the memory cell $MC_{S2L}$ is detected by the sense amplifier module SAM (see FIG. 6), and data indicating the state of the memory cell $MC_{S2L}$ is acquired. At this time, the signal line XXL is set to an "H" state at time t345, and the signal line XXL is set to an "L" state at time t346.

At time t346 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 26, among a plurality of memory cells $MC_{S3}$ corresponding to the S3 state, a memory cell $MC_{S3}$ adjacent to the adjacent memory cell MC determined to be in the OFF state in step S201 (hereinafter, may be referred to as a "memory cell $MC_{S3H}$") is selected.

At time t347 of the verify operation, a predetermined verify voltage (the verify voltage $V_{VFY3}$ in the example of FIG. 26) is supplied to the selected word line $WL_S$.

At time t348 to time t349 of the verify operation, the ON state/OFF state of the memory cell $MC_{S3H}$ is detected by the sense amplifier module SAM (see FIG. 6), and data indicating the state of the memory cell $MC_{S3H}$ is acquired. At this time, the signal line XXL is set to an "H" state at time t348, and the signal line XXL is set to an "L" state at time t349.

Time period t1 between time t348 and time t349 is shorter than time period t2 between time t350 and time t351.

At time t349 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 26, among the plurality of memory cells $MC_{S3}$ corresponding to the S3 state, a memory cell $MC_{S3}$ adjacent to the adjacent memory cell MC determined to be in the ON state in step S201 (hereinafter, may be referred to as a "memory cell $MC_{S3L}$") is selected.

At time t350 to time t351 of the verify operation, the ON state/OFF state of the memory cell $MC_{S3L}$ is detected by the sense amplifier module SAM (see FIG. 6), and data indicating the state of the memory cell $MC_{S3L}$ is acquired. At this time, the signal line XXL is set to an "H" state at time t350, and the signal line XXL is set to an "L" state at time t351.

The example of FIG. 26 illustrates a case where three verify voltages $V_{VFY}$ corresponding to three states are supplied to the selected word line $WL_S$ in the verify operation. However, the number of verify voltages $V_{VFY}$ supplied to the selected word line $WL_S$ in the verify operation may be two or less, four or more, or may change according to the number of loops $n_W$.

Further, in the example of FIG. 26, by supplying the three verify voltages $V_{VFY}$ to the selected word line $WL_S$ and adjusting the time from when the signal line XXL is set to the "H" state to when it is set to the "L" state, the verify operation by six verify voltages is executed. However, such a method is merely an example, and details of the method may be adjusted as appropriate. For example, in actuality, both the verify voltage $V_{VFY}$" and the verify voltage $V_{VFY}$" (see FIG. 15) may be supplied to the selected word line $WL_S$. Steps S205 to S209 (see FIG. 25) are executed in the same manner as steps S104 to S108 in FIG. 14.

Second Embodiment

Figure 27:
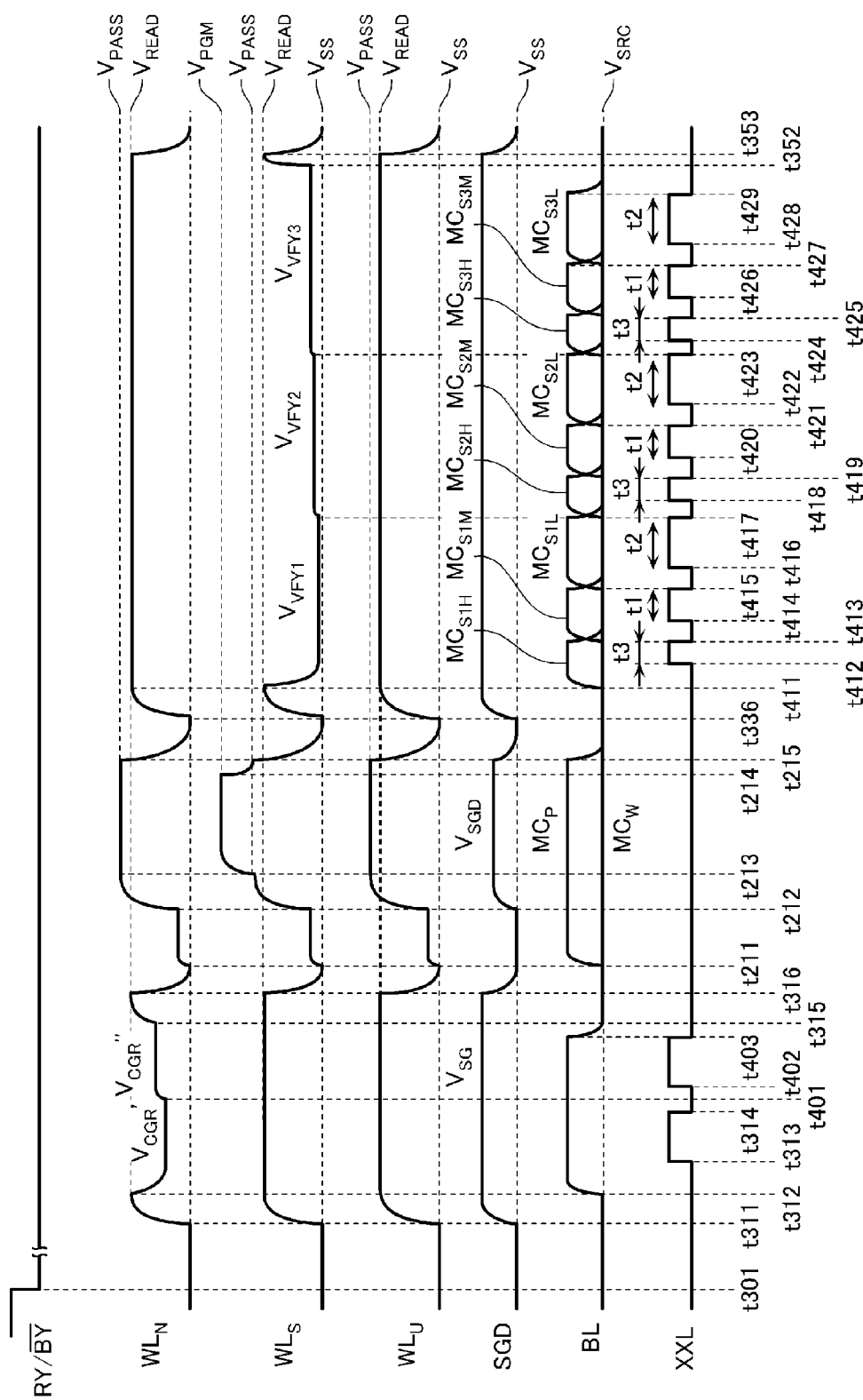
FIG. 27 is a schematic voltage diagram of a write sequence corresponding to fine write according to a second embodiment.

Next, a semiconductor storage device according to a second embodiment will be described with reference to FIG. 27. FIG. 27 is a schematic voltage diagram of a write sequence corresponding to fine write according to the second embodiment.

The fine write according to the second embodiment is for the most part executed in the same manner as the fine write according to the first embodiment.

However, in the first embodiment, one type of read voltage $V_{CGR}$' was supplied to the adjacent word line $WL_N$ in the adjacent page read operation (step S201 in FIG. 25).

In the second embodiment, two types of read voltages $V_{CGR}$' and $V_{CGR}$" having different magnitudes are supplied to the adjacent word line $WL_N$ in the adjacent page read operation (step S201 in FIG. 25). For example, as illustrated in FIG. 27, the voltage of the adjacent word line $WL_N$ is changed from the read voltage $V_{CCR}$' to the read voltage $V_{CGR}$" at time t401, and the ON state/OFF state of the adjacent memory cell MC is detected at the subsequent times t402 to t403. The read voltages $V_{CCR}$' and $V_{CGR}$" may be, for example, two of the verify voltages $V_{VFY1}$' to $V_{VFY15}$' (see FIG. 23).

Furthermore, in the first embodiment, according to the result of the adjacent page read operation, a plurality of memory cells $MC_{S1}$, $MC_{S2}$, $MC_{S3}$, ... corresponding to the S1 state to the S15 state is classified into two types (memory cells $MC_{S1H}$, $MC_{S2H}$, $MC_{S3H}$, ... and memory cells $MC_{S1L}$, $MC_{S2L}$, $MC_{S3L}$, ... ), and the states of these memory cells MC are detected under different conditions during the verify operation.

However, in the second embodiment, according to the result of the adjacent page read operation, a plurality of memory cells $MC_{S1}$, $MC_{S2}$, $MC_{S3}$, ... corresponding to the S1 state to the S15 state is classified into three types (memory cells $MC_{S1H}$, $MC_{S2H}$, $MC_{S3H}$, ..., memory cells $MC_{S1M}$, $MC_{S2M}$, $MC_{S3M}$, ..., and memory cells $MC_{S1L}$, $MC_{S2L}$, $MC_{S3L}$, ... ), and the states of these memory cells MC are detected under different conditions during the verify operation.

For example, at time t411 of the verify operation, a predetermined verify voltage (verify voltage $V_{VFY1}$ in the example of FIG. 27) is supplied to the selected word line $WL_S$.

At time t411, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 27, among a plurality of memory cells $MC_{S1}$ corresponding to the S1 state, a memory cell $MC_{S1}$ adjacent to the adjacent memory cell MC determined to be in an OFF state twice in the adjacent page read operation (hereinafter, may be referred to as a "memory cell $MC_{S1H}$") is selected.

At time t412 to time t413 of the verify operation, the ON state/OFF state of the memory cell $MC_{S1H}$ is detected by the sense amplifier module SAM (see FIG. 6), and data indicating the state of the memory cell $MC_{S1H}$ is acquired. At this time, the signal line XXL is set to an "H" state at time t412, and the signal line XXL is set to an "L" state at time t413.

Time period t3 between time t412 and time t413 is shorter than time period t1 between time t414 and time t415 and time period t2 between time t416 and time t417.

At time t413 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 27, among the plurality of memory cells $MC_{S1}$ corresponding to the S1 state, a memory cell $MC_{S1}$ adjacent to the adjacent memory cell MC determined to be in an OFF state once and in an ON state once in the adjacent page read operation (hereinafter, may be referred to as a "memory cell $MC_{S1M}$") is selected.

At time t414 to time t415 of the verify operation, the ON state/OFF state of the memory cell $MC_{S1M}$ is detected by the sense amplifier module SAM (see FIG. 6), and data indicating the state of the memory cell $MC_{S1M}$ is acquired. At this time, the signal line XXL is set to an "H" state at time t414, and the signal line XXL is set to an "L" state at time t415.

At time t415 of the verify operation, for example, the bit line BL is charged. At this time, for example, based on the data in the latch circuits DL0 to $DLn_L$, the voltage $V_{DD}$ is supplied to a bit line BL connected to a specific memory cell MC, and the voltage $V_{SRC}$ is supplied to the other bit lines BL. In the example of FIG. 27, among the plurality of memory cells $MC_{S1}$ corresponding to the S1 state, a memory cell $MC_{S1}$ adjacent to the adjacent memory cell MC determined to be in an ON state twice in the adjacent page read operation (hereinafter, may be referred to as a "memory cell $MC_{S1L}$") is selected.

At time t416 to time t417 of the verify operation, the ON state/OFF state of the memory cell $MC_{S1L}$ is detected by the sense amplifier module SAM (see FIG. 6), and data indicating the state of the memory cell $MC_{S1L}$ is acquired. At this time, the signal line XXL is set to an "H" state at time t416, and the signal line XXL is set to an "L" state at time t417.

At time t417 of the verify operation, a predetermined verify voltage (the verify voltage $V_{VFY2}$ in the example of FIG. 27) is supplied to the selected word line $WL_S$.

Further, at time t417, for example, the bit line BL is charged. At this time, for example, based on the data in the latch circuits DL0 to DLn$_L$, the voltage V$_{DD}$ is supplied to a bit line BL connected to a specific memory cell MC, and the voltage V$_{SRC}$ is supplied to the other bit lines BL. In the example of FIG. 27, among a plurality of memory cells MC$_{S2}$ corresponding to the S2 state, a memory cell MC$_{S2}$ adjacent to the adjacent memory cell MC determined to be in an OFF state twice in the adjacent page read operation (hereinafter, may be referred to as a "memory cell MC$_{S2H}$") is selected.

At time t418 to time t419 of the verify operation, the ON state/OFF state of the memory cell MC$_{S2H}$ is detected by the sense amplifier module SAM (see FIG. 6), and data indicating the state of the memory cell MC$_{S2H}$ is acquired. At this time, the signal line XXL is set to an "H" state at time t418, and the signal line XXL is set to an "L" state at time t419.

Time period t3 between time t418 and time t419 is shorter than time period t1 between time t420 and time t421 and time period t2 between time t422 and time t423.

At time t419 of the verify operation, for example, the bit line BL is charged. At this time, for example, based on the data in the latch circuits DL0 to DLn$_L$, the voltage V$_{DD}$ is supplied to a bit line BL connected to a specific memory cell MC, and the voltage V$_{SRC}$ is supplied to the other bit lines BL. In the example of FIG. 27, among the plurality of memory cells MC$_{S2}$ corresponding to the S2 state, a memory cell MC$_{S2}$ adjacent to the adjacent memory cell MC determined to be in an OFF state once and in an ON state once in the adjacent page read operation (hereinafter, may be referred to as a "memory cell MC$_{S2M}$") is selected.

At time t420 to time t421 of the verify operation, the ON state/OFF state of the memory cell MC$_{S2M}$ is detected by the sense amplifier module SAM (see FIG. 6), and data indicating the state of the memory cell MC$_{S2M}$ is acquired. At this time, the signal line XXL is set to an "H" state at time t420, and the signal line XXL is set to an "L" state at time t421.

At time t421 of the verify operation, for example, the bit line BL is charged. At this time, for example, based on the data in the latch circuits DL0 to DLn$_L$, the voltage V$_{DD}$ is supplied to a bit line BL connected to a specific memory cell MC, and the voltage V$_{SRC}$ is supplied to the other bit lines BL. In the example of FIG. 27, among the plurality of memory cells MC$_{S2}$ corresponding to the S2 state, a memory cell MC$_{S2}$ adjacent to the adjacent memory cell MC determined to be in the ON state twice in the adjacent page read operation (hereinafter, may be referred to as a "memory cell MC$_{S2L}$") is selected.

At time t422 to time t423 of the verify operation, the ON state/OFF state of the memory cell MC$_{S2L}$ is detected by the sense amplifier module SAM (see FIG. 6), and data indicating the state of the memory cell MC$_{S2L}$ is acquired. At this time, the signal line XXL is set to an "H" state at time t422, and the signal line XXL is set to an "L" state at time t423.

At time t423 of the verify operation, a predetermined verify voltage (the verify voltage V$_{VFY3}$ in the example of FIG. 27) is supplied to the selected word line WL$_S$.

Further, at time t423 of the verify operation, for example, the bit line BL is charged. At this time, for example, based on the data in the latch circuits DL0 to DLn$_L$, the voltage V$_{DD}$ is supplied to a bit line BL connected to a specific memory cell MC, and the voltage V$_{SRC}$ is supplied to the other bit lines BL. In the example of FIG. 27, among a plurality of memory cells MC$_{S3}$ corresponding to the S3 state, a memory cell MC$_{S3}$ adjacent to the adjacent memory cell MC determined to be in the OFF state twice in the adjacent page read operation (hereinafter, may be referred to as a "memory cell MC$_{S3H}$") is selected.

At time t424 to time t425 of the verify operation, the ON state/OFF state of the memory cell MC$_{S3H}$ is detected by the sense amplifier module SAM (see FIG. 6), and data indicating the state of the memory cell MC$_{S3H}$ is acquired. At this time, the signal line XXL is set to an "H" state at time t424, and the signal line XXL is set to an "L" state at time t425.

Time period t3 between time t424 and time t425 is shorter than time period t1 between time t426 and time t427 and time period t2 between time t428 and time t429.

At time t425 of the verify operation, for example, the bit line BL is charged. At this time, for example, based on the data in the latch circuits DL0 to DLn$_L$, the voltage V$_{DD}$ is supplied to a bit line BL connected to a specific memory cell MC, and the voltage V$_{SRC}$ is supplied to the other bit lines BL. In the example of FIG. 27, among the plurality of memory cells MC$_{S3}$ corresponding to the S3 state, a memory cell MC$_{S3}$ adjacent to the adjacent memory cell MC determined to be in the OFF state once and in the ON state once in the adjacent page read operation (hereinafter, may be referred to as a "memory cell MC$_{S3M}$") is selected.

At time t426 to time t427 of the verify operation, the ON state/OFF state of the memory cell MC$_{S3M}$ is detected by the sense amplifier module SAM (see FIG. 6), and data indicating the state of the memory cell MC$_{S3M}$ is acquired. At this time, the signal line XXL is set to an "H" state at time t426, and the signal line XXL is set to an "L" state at time t427.

At time t427 of the verify operation, for example, the bit line BL is charged. At this time, for example, based on the data in the latch circuits DL0 to DLn$_L$, the voltage V$_{DD}$ is supplied to a bit line BL connected to a specific memory cell MC, and the voltage V$_{SRC}$ is supplied to the other bit lines BL. In the example of FIG. 27, among the plurality of memory cells MC$_{S3}$ corresponding to the S3 state, a memory cell MC$_{S3}$ adjacent to the adjacent memory cell MC determined to be in the ON state twice in the adjacent page read operation (hereinafter, may be referred to as a "memory cell MC$_{S3L}$") is selected.

At time t428 to time t429 of the verify operation, the ON state/OFF state of the memory cell MC$_{S3L}$ is detected by the sense amplifier module SAM (see FIG. 6), and data indicating the state of the memory cell MC$_{S3L}$ is acquired. At this time, the signal line XXL is set to an "H" state at time t428, and the signal line XXL is set to an "L" state at time t429.

The example of FIG. 27 illustrates a case where three verify voltages V$_{VFY}$ corresponding to three states are supplied to the selected word line WL$_S$ in the verify operation. However, the number of verify voltages V$_{VFY}$ supplied to the selected word line WL$_S$ in the verify operation may be two or less, four or more, or may change according to the number of loops n$_W$.

Further, in the example of FIG. 27, by supplying the three verify voltages V$_{VFY}$ to the selected word line WL$_S$ and adjusting the time from when the signal line XXL is set to the "H" state to when it is set to the "L" state, the verify operation by nine verify voltages is executed. However, such a method is merely an example, and details of the method may be adjusted as appropriate. For example, in actuality, nine voltages may be supplied to the selected word line WL$_S$.

Further, in the example of FIG. 27, according to the result of the adjacent page read operation, the plurality of memory cells MC$_{S1}$, MC$_{S2}$, MC$_{S3}$, . . . corresponding to the S1 state to the S15 state are classified into three types, and the states of these memory cells MC are detected under different conditions during the verify operation. However, such a method is merely an example, and details of the method may be adjusted as appropriate. For example, according to the result of the adjacent page read operation, the plurality of memory cells $MC_{S1}$, $MC_{S2}$, $MC_{S3}$, . . . corresponding to the S1 state to the S15 state may be classified into four or more types. In such a case, in the adjacent page read operation, three or more types of read voltages having different magnitudes may be supplied to the adjacent word line $WL_N$.

Third Embodiment

Figure 28:
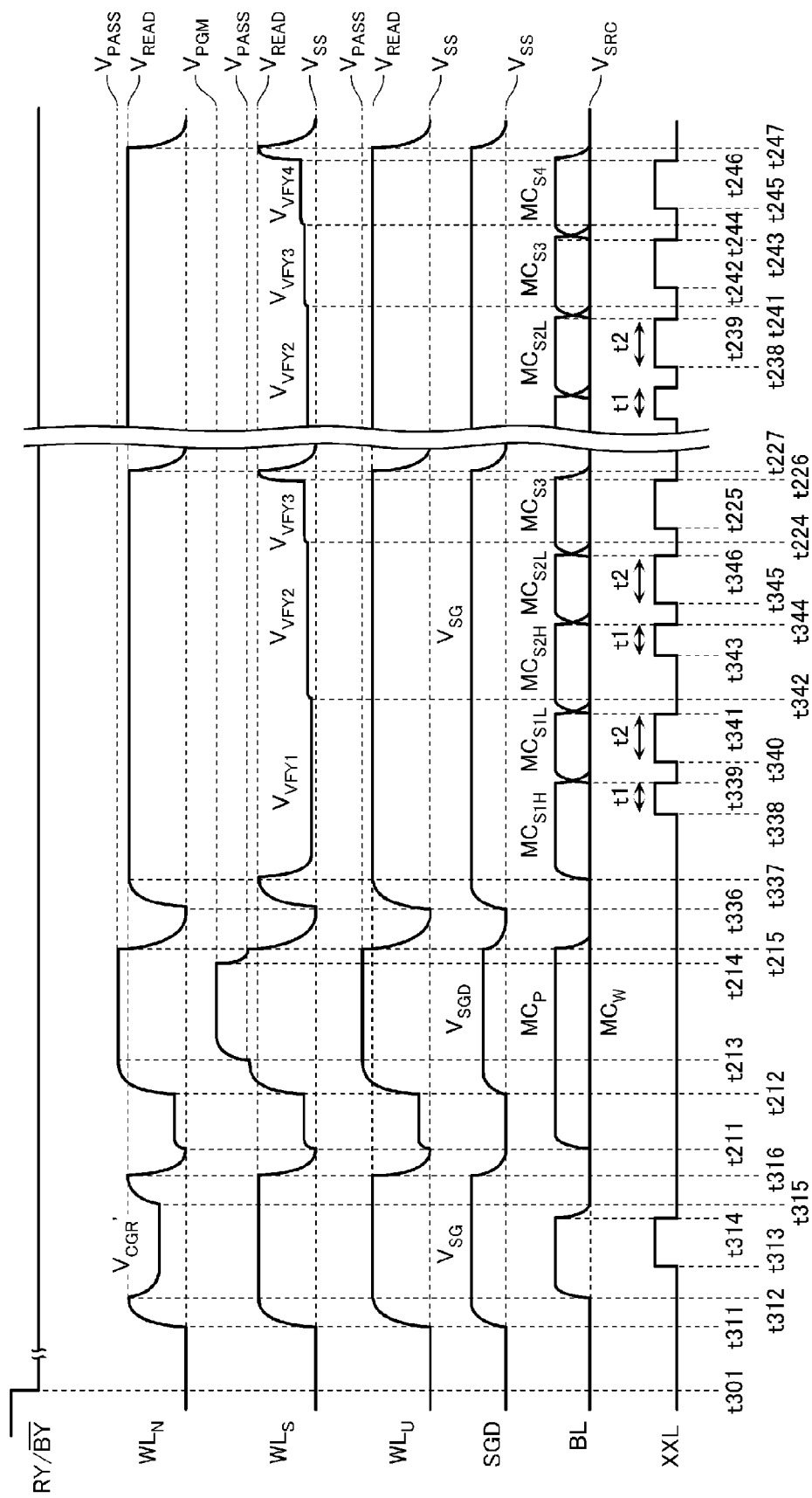
FIG. 28 is a schematic voltage diagram of a write sequence corresponding to fine write according to a third embodiment.

Next, a semiconductor storage device according to a third embodiment will be described with reference to FIG. 28. FIG. 28 is a schematic voltage diagram of a write sequence corresponding to fine write according to the third embodiment.

The fine write according to the present embodiment is basically executed in the same manner as the fine write according to the first embodiment or the second embodiment.

In the first embodiment or the second embodiment, a plurality of memory cells $MC_{S1}$, $MC_{S2}$, $MC_{S3}$, . . . corresponding to the S1 state to the S15 state is classified into a plurality of types, and the states of these memory cells MC are detected under different conditions during the verify operation (step S104 in FIG. 25).

However, with such a method, the time required for the verify operation may become longer.

Here, the influence of the interference between adjacent word lines appears more strongly in a memory cell MC in a state with a lower threshold voltage. Therefore, in the third embodiment, among the memory cells MC with the S1 state to the S15 state, only the memory cells MC with states corresponding to a relatively low threshold voltage are controlled with the same method as the first embodiment or the second embodiment, and the memory cells MC corresponding to the remaining higher threshold voltage states are controlled with a method described with reference to FIG. 15, etc.

For example, in the example of FIG. 28, a plurality of memory cells $MC_{S1}$ and $MC_{S2}$ of the S1 state and the S2 state is classified into two types (memory cells $MC_{S1H}$ and $MC_{S2H}$ and memory cells $MC_{S1L}$ and $MC_{S2L}$), respectively. However, the plurality of memory cells MC of the S3 state to the S15 state is not classified in this way. That is, in the example of FIG. 28, a plurality of memory cells $MC_{S1}$, $MC_{S2}$, $MC_{S3}$, . . . corresponding to the S1 state to the S15 state is classified into a total of 17 types. Further, in the verify operation, the states of these memory cells MC are detected under 17 different conditions.

Fourth Embodiment

Figure 29:
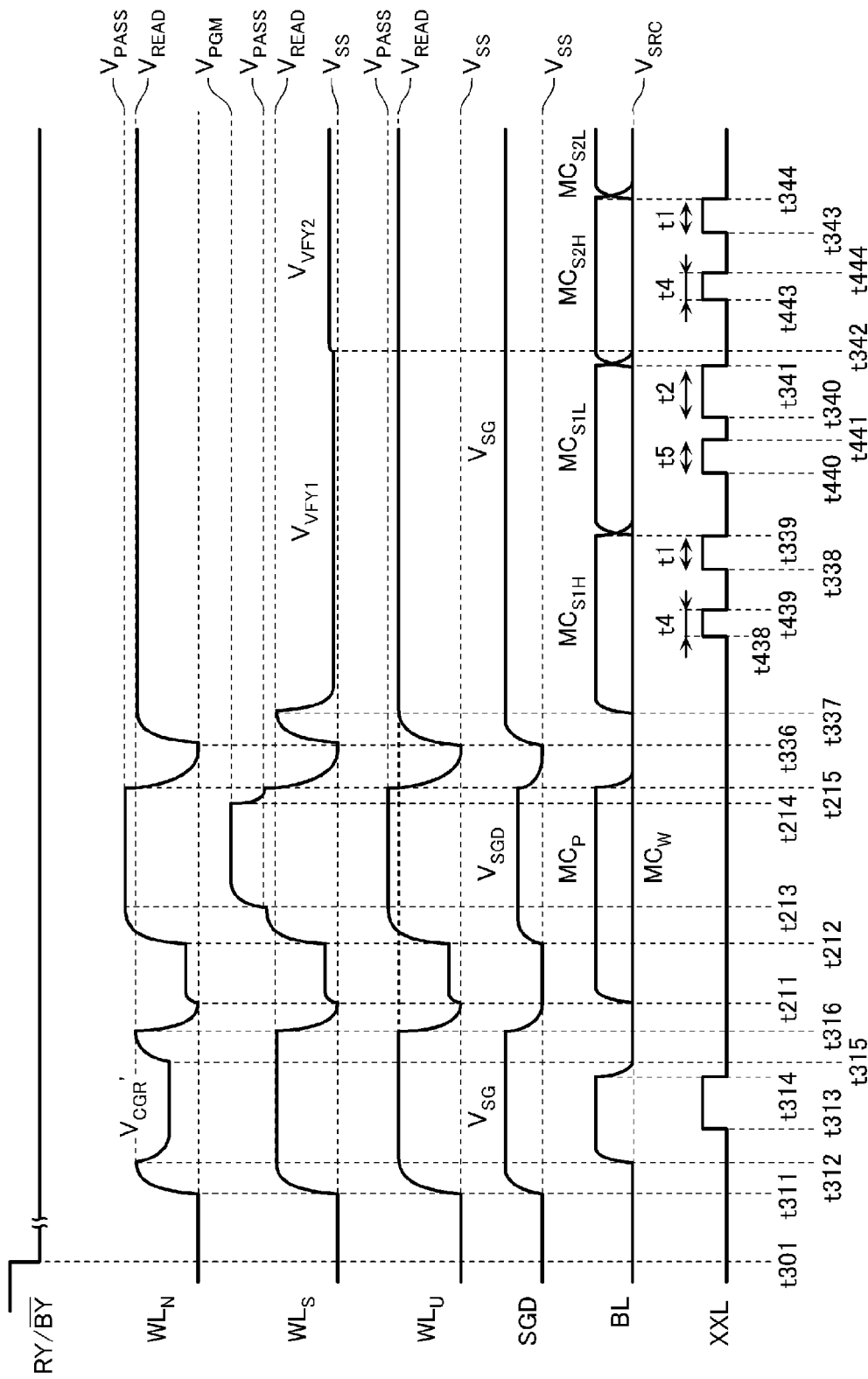
FIG. 29 is a schematic voltage diagram of a write sequence corresponding to fine write according to a fourth embodiment.
Figure 30:
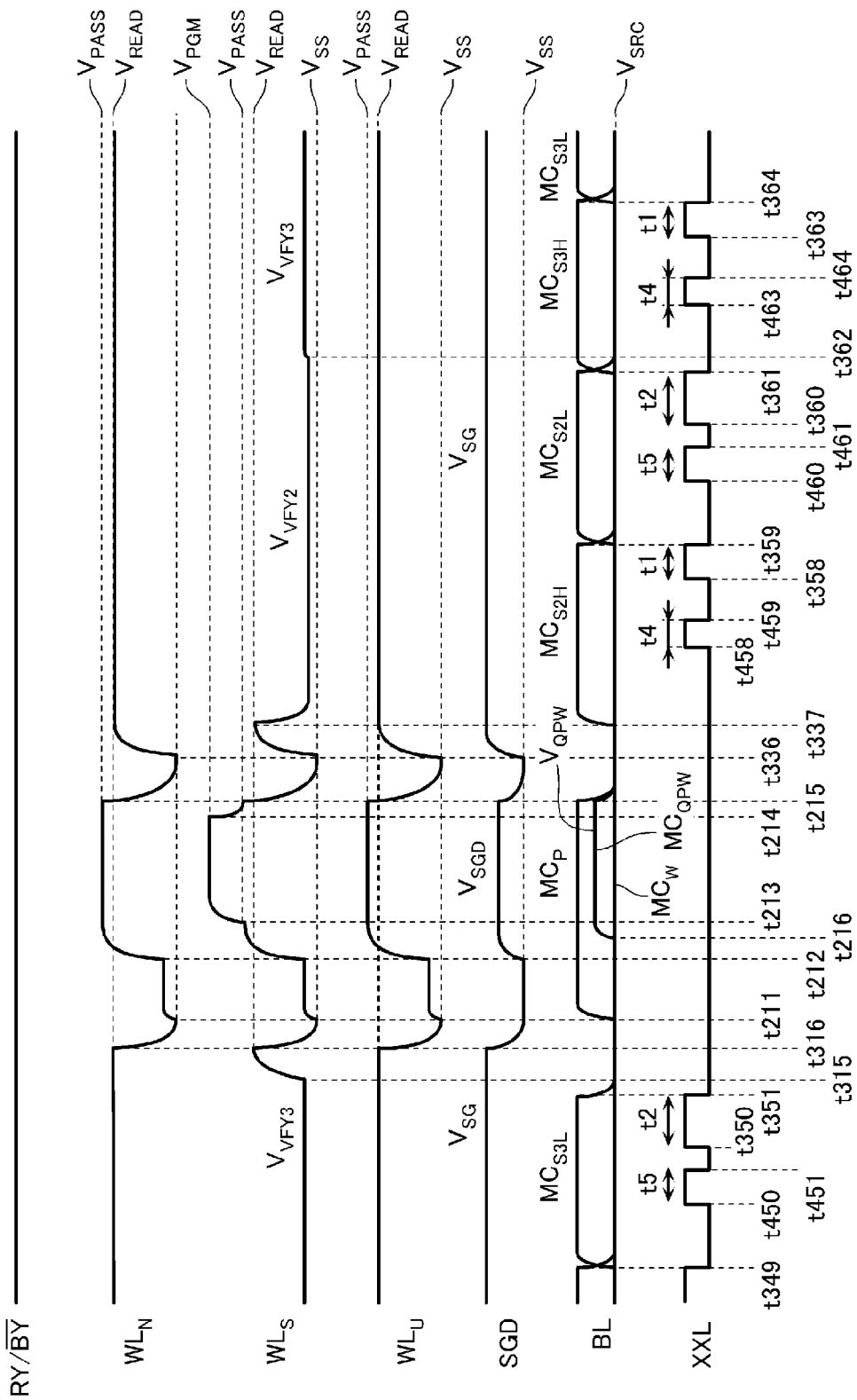
FIG. 30 is a schematic voltage diagram of a write sequence corresponding to fine write according to the fourth embodiment.

Next, a semiconductor storage device according to a fourth embodiment will be described with reference to FIGS. 29 and 30. FIGS. 29 and 30 are schematic voltage diagrams of a write sequence corresponding to fine write according to the fourth embodiment.

The fine write according to the present embodiment is basically executed in the same manner as the fine write according to any one of the first to third embodiments.

However, in the fourth embodiment, in the verify operation, write memory cells $MC_W$ are classified into two types: one having a threshold voltage that is somewhat away from a target value; and the other having a threshold voltage that is somewhat close to the target value. Further, in the program operation, the voltage $V_{SRC}$ is supplied to a bit line BL connected to a write memory cell $MC_W$ whose threshold voltage is somewhat away from the target value, and a voltage $V_{QPW}$ larger than the voltage $V_{SRC}$ is supplied to a bit line BL connected to a write memory cell $MC_W$ whose threshold voltage is somewhat close to the target value (hereinafter, may be referred to as a "memory cell $MC_{QPW}$").

With such a method, in the memory cell $MC_{QPW}$ whose threshold voltage is somewhat close to the target value, it is possible to make the amount of charges accumulated in the charge storage film 132 (see FIG. 10) smaller than that in the other write memory cells $MC_W$. As a result, it is possible to prevent the threshold voltage of the memory cell MC from becoming larger than a target threshold voltage range.

For example, in the example of FIG. 29, at time t438 to time t439 between time t337 and time t338, the ON state/OFF state of a memory cell $MC_{S1H}$ is detected by the sense amplifier module SAM (see FIG. 6), and data indicating the state of the memory cell $MC_{S1H}$ is acquired. At this time, the signal line XXL is set to an "H" state at time t438, and the signal line XXL is set to an "L" state at time t439.

Time period t4 between time t438 and time t439 is shorter than time period t1 between time t338 and time t339.

Among memory cells $MC_{S1H}$, one that is in an OFF state between time t438 and time t439 and in an ON state between time t338 and time t339 is classified as a memory cell $MC_{QPW}$ in the next program operation.

In the example of FIG. 29, at time t440 to time t441 between time t339 and time t340, the ON state/OFF state of a memory cell $MC_{S1L}$ is detected by the sense amplifier module SAM (see FIG. 6), and data indicating the state of the memory cell $MC_{S1L}$ is acquired. At this time, the signal line XXL is set to an "H" state at time t430, and the signal line XXL is set to an "L" state at time t431.

The time period t5 between time t430 and time t431 is shorter than time period t2 between time t340 and time t341.

Among memory cells $MC_{S1L}$, one that is in an OFF state between time t430 and time t431 and in an ON state between time t340 and time t341 is classified as a memory cell $MC_{QPW}$ in the next program operation.

Further, in the example of FIG. 29, at time t443 to time t444 between time t342 and time t343, the ON state/OFF state of a memory cell $MC_{S2H}$ is detected by the sense amplifier module SAM (see FIG. 6), and data indicating the state of the memory cell $MC_{S2H}$ is acquired. At this time, the signal line XXL is set to an "H" state at time t443, and the signal line XXL is set to an "L" state at time t444.

Further, time period t4 between time t443 and time t444 is shorter than time period t1 between time t343 and time t344.

Among memory cells $MC_{S2H}$, one that is in an OFF state between time t443 and time t444 and in an ON state between time t343 and time t344 is classified as a memory cell $MC_{QPW}$ in the next program operation.

Although not specifically illustrated, at time (see FIG. 26) between time t344 and time t345, the ON state/OFF state of a memory cell $MC_{S2L}$ is detected by the sense amplifier module SAM (see FIG. 6), and data indicating the state of the memory cell $MC_{S2L}$ is acquired. The operation during this period is the same as the operation executed at a time between time t430 and time t431.

Further, although not specifically illustrated, at a time (see FIG. 26) between time t347 and time t348, the ON state/OFF state of the memory cell $MC_{S2L}$ is detected by the sense amplifier module SAM (see FIG. 6), and data indicating the state of the memory cell $MC_{S2L}$ is acquired. The operation during this period is the same as the operation executed at a time between time t443 and time t444.

Further, in the example of FIG. 30, at time t450 to time t451 between time t349 and time t350, the ON state/OFF state of a memory cell $MC_{S3L}$ is detected by the sense amplifier module SAM (see FIG. 6), and data indicating the state of the memory cell $MC_{S3L}$ is acquired. At this time, the signal line XXL is set to an "H" state at time t450, and the signal line XXL is set to an "L" state at time t451.

The time period t5 between time t450 and time t451 is shorter than time period t2 between time t350 and time t351.

Among memory cells $MC_{S3L}$, one that is in an OFF state between time t450 and time t451 and in an ON state between time t350 and time t351 is classified as a memory cell $MC_{QPW}$ in the next program operation.

Further, in the example of FIG. 30, at time t216 between time t212 and time t214, the voltage $V_{QPW}$ is supplied to a bit line BL connected to the memory cell $MC_{QPW}$. The voltage of the bit line BL may be adjusted, for example, by adjusting the voltage of the clamp transistor 44 of FIG. 7 and changing the data of the latch circuit SDL corresponding to the memory cell $MC_{QPW}$ at time t216 in this state.

At time t458 to time t364 of FIG. 30, the operation corresponding to time t438 to time t344 of FIG. 29 is executed for memory cells MC of other states.

Here, the examples of FIGS. 29 and 30 illustrates a case where three verify voltages $V_{VFY}$ corresponding to three states are supplied to the selected word line $WL_S$ in the verify operation. However, the number of verify voltages $V_{VFY}$ supplied to the selected word line $WL_S$ in the verify operation may be two or less, four or more, or may change according to the number of loops $n_W$.

In the examples of FIGS. 29 and 30, by supplying the three verify voltages $V_{VFY}$ to the selected word line $WL_S$ and adjusting the time from when the signal line XXL is set to the "H" state to when it is set to the "L" state, the verify operation by 12 verify voltages is executed. However, such a method is merely an example, and details of the method may be adjusted as appropriate. For example, in actuality, 12 voltages may be supplied to the selected word line $WL_S$.

Furthermore, in the examples of FIGS. 29 and 30, according to the result of the adjacent page read operation, the plurality of memory cells $MC_{S1}$, $MC_{S2}$, $MC_{S3}$, ... corresponding to the S1 state to the S15 state are classified into two types, and the states of these memory cells MC are detected under different conditions during the verify operation. Further, in order to classify these 30 memory cells MC into two types: one having a threshold voltage that is somewhat away from a target value; and the other having a threshold voltage that is somewhat close to the target value, the states of the memory cells MC are detected under 60 different conditions.

However, such a method is merely an example, and details of the method may be adjusted as appropriate.

For example, according to the result of the adjacent page read operation, the plurality of memory cells $MC_{S1}$, $MC_{S2}$, $MC_{S3}$, ... corresponding to the S1 state to the S15 state may be classified into three or more types. In such a case, in the adjacent page read operation, two or more types of read voltages having different magnitudes may be supplied to the adjacent word line $WL_N$.

Further, the influence of the interference between adjacent word lines appears more strongly in a memory cell MC in a state corresponding to a lower threshold voltage. Therefore, as in the third embodiment (see FIG. 28), among the memory cells MC corresponding to the S1 state to the S15 state, only the memory cells MC of a part of states corresponding to a relatively low threshold voltage may be classified according to the result of the adjacent page read operation.

For example, in the example of FIG. 28, the plurality of memory cells MC corresponding to the S1 state to the S15 state are classified into a total of 17 types. In such a case, all the 17 memory cells MC may be classified into one having a threshold voltage that is somewhat away from a target value, and the other having a threshold voltage that is somewhat close to the target value. Such classification may be performed on only a part of the 17 memory cells MC.

Figure 31:
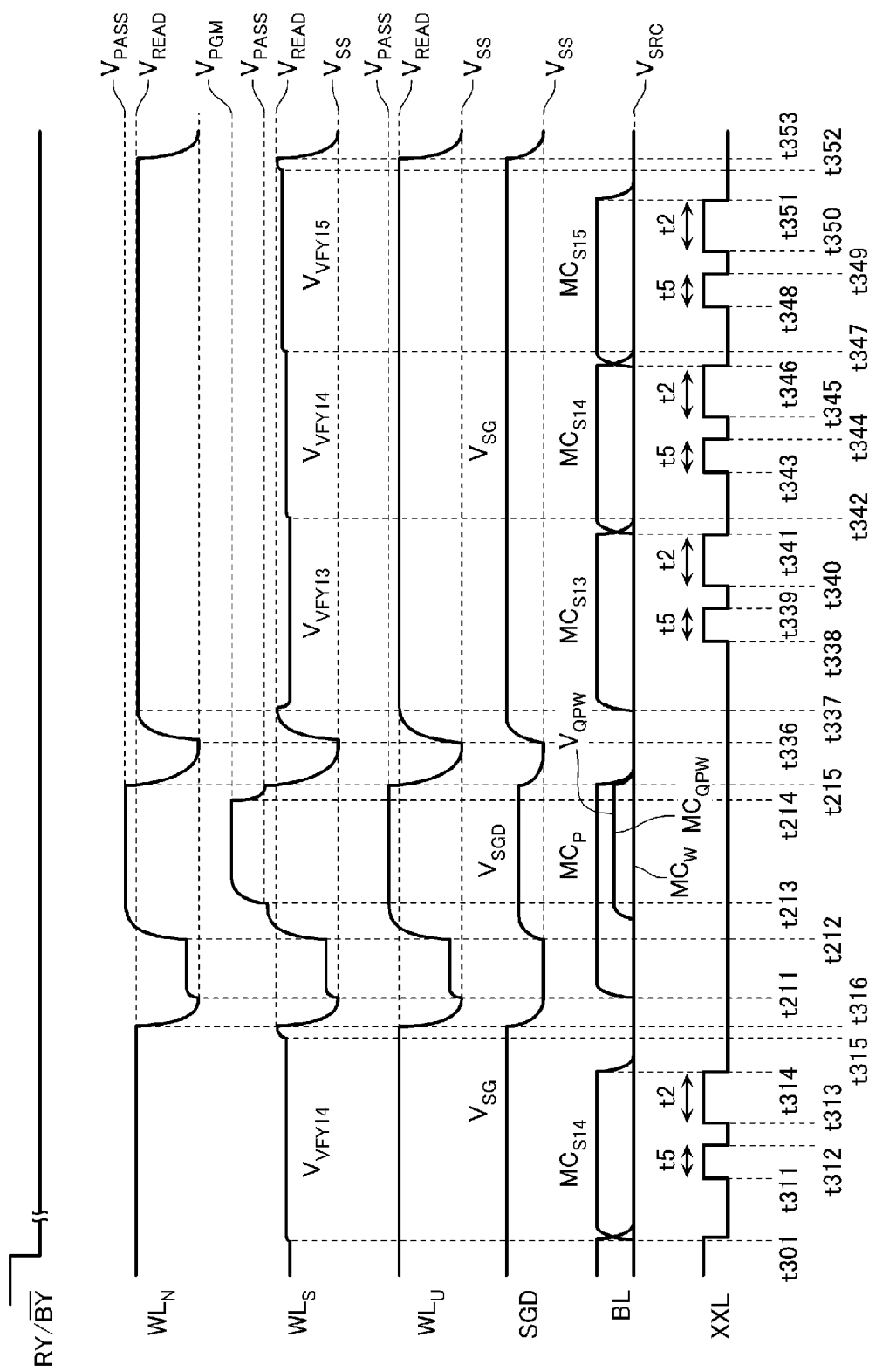
FIG. 31 is a schematic voltage diagram of a write sequence corresponding to fine write according to the fourth embodiment.

For example, when only the memory cells MC of a part of states corresponding to a relatively low threshold voltage are classified according to the result of the adjacent page read operation, it is also possible to discard the result of the adjacent page read operation from the latch circuits DL0 to $DLn_L$ at the point of time when the number of loops $n_W$ (see FIG. 14) reaches a certain value. In such a case, for example, in the verify operation corresponding to the number of loops $n_W$ after the result of the adjacent page read operation is discarded, the memory cells MC of a part of states may be classified into one having a threshold voltage that is somewhat away from a target value, and the other having a threshold voltage that is somewhat close to the target value. Further, in this classification, among the latch circuits DL0 to $DLn_L$, the one in which the result of the adjacent page read operation is latched may be used (see FIG. 31). With such a method, it is possible to reduce the number of latch circuits DL0 to $DLn_L$ required for fine write by one for each bit line BL. Therefore, it is possible to reduce a circuit area.

Other Embodiments

The semiconductor storage devices according to the first to fourth embodiments have been described above. However, the above embodiments are merely examples, and specific configurations and methods, thereof may be adjusted as appropriate.

For example, in the semiconductor storage devices according to the first to fourth embodiments, the foggy fine write is adopted when data are written. Further, the adjacent page read operation is performed in the verify operation in the fine write, and the conditions of the verify operation of each write memory cell $MC_W$ are adjusted according to the result of the adjacent page read operation. However, even when a write method other than the foggy fine write is a method of adjusting the threshold voltages of the selected memory cell MC and the adjacent memory cells MC in advance to a certain extent and after that, adjusting the threshold voltage of the selected memory cell MC, the method illustrated in at least one of the first to fourth embodiments may be applied.

Figure 32:
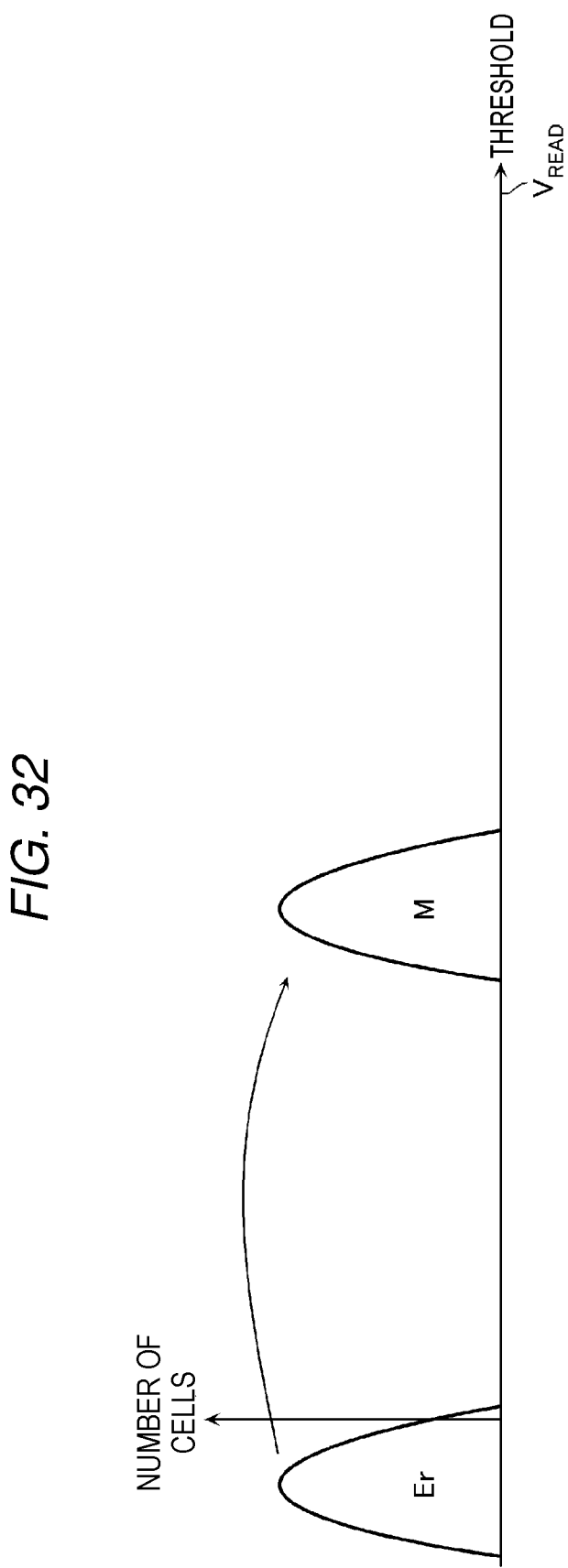
FIG. 32 is a schematic voltage diagram of a write sequence according to other embodiments.
Figure 33:
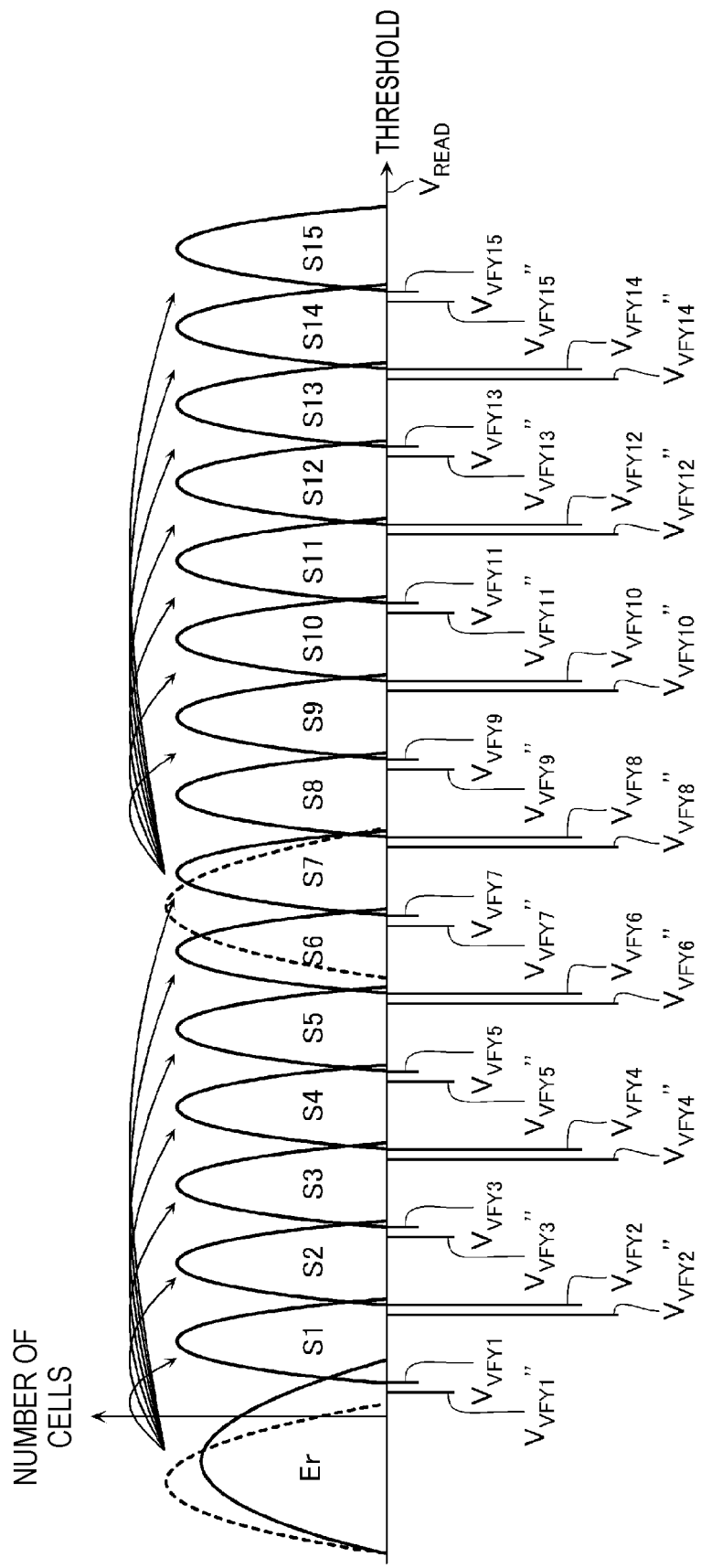
FIG. 33 is a schematic voltage diagram of a write sequence according to other embodiments.

For example, FIGS. 32 and 33 illustrate an example in which the method illustrated in the first embodiment is applied to two-stage write instead of the foggy fine write. The two-stage write includes 1st stage write and 2nd stage write. These 1st stage write and 2nd stage write are one aspect of the write sequence described with reference to FIGS. 14 to 17.

The 1st stage write and the 2nd stage write are executed in the same order as, for example, the foggy write and the fine write illustrated in FIG. 22. For example, the 1st stage write in the page $PGn_P$ is executed as the 2nth write sequence, and the 2nd stage write in the page $PGn_P-1$ is executed as the $2n_P+1$st write sequence.

As illustrated in FIG. 32, the 1st stage write is executed for the page PG in the erase state. In the foggy write, as illustrated in FIG. 32, the memory cell $MC_{Se}$ to the memory cell $MC_{S15}$ in the page PG are controlled to a threshold voltage corresponding to the M state by one write sequence.

The 1st stage write is basically executed by the method described with reference to FIGS. 14 to 17. However, in the 1st stage write, only one verify voltage is used in each write loop. This verify voltage is smaller than, for example, the verify voltage $V_{VFY8}$ corresponding to the S8 state.

The 2nd stage write is executed in the same manner as the fine write according to the first embodiment, the third embodiment, or the fourth embodiment. FIG. 33 illustrates a state in which the 2nd stage write is executed in the same manner as the fine write according to the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of memory strings, each including first and second memory transistors adjacent to each other;
   a plurality of bit lines connected to the memory strings, respectively;
   a plurality of sense transistors having gates connected to the bit lines, respectively;
   a plurality of first transistors connected between the bit lines and the gates of the sense transistors, respectively; and
   a control circuit configured to perform, during a first write sequence, a read operation with respect to the second memory transistors of the memory strings, a program operation with respect to the first memory transistors of the memory strings, and a verify operation with respect to the first memory transistors of the memory strings, in this order, wherein
   during the read operation, the control circuit determines a first part of the second memory transistors having a threshold voltage higher than a predetermined value and a second part of the second memory transistors not having a threshold voltage higher than the predetermined value, and
   during the verify operation, the control circuit turns on the first transistors during a first sense period while one or more of the bit lines connected to the first part are at a first voltage and one or more of the bit lines connected to the second part are at a second voltage lower than the first voltage, and then turns on the first transistors during a second sense period longer than the first sense period while the one or more of the bit lines connected to the first part are at the second voltage and the one or more of the bit lines connected to the second part are at the first voltage.

2. The semiconductor storage device according to claim 1, wherein
   during the read operation, the control circuit determines a third part of the second memory transistors having a threshold voltage higher than a second predetermined value different from the predetermined value and a fourth part of the second memory transistors not having a threshold voltage higher than the second predetermined value, and
   during the verify operation, the control circuit turns on the first transistors during a third sense period while one or more of the bit lines connected to the third part are at the first voltage and one or more of the bit lines connected to the fourth part are at the second voltage, and then turns on the first transistors during a fourth sense period longer than the third sense period while the one or more of the bit lines connected to the third part are at the second voltage and the one or more of the bit lines connected to the fourth part are at the first voltage.

3. The semiconductor storage device according to claim 2, wherein
   the semiconductor storage device stores values of a plurality of verify voltages, and
   the control circuit controls gates of the first memory transistors to be at a first one of the stored verify voltages during the first and second sense periods, and at a second one of the verify voltages different from the first one during the third and fourth sense periods.

4. The semiconductor storage device according to claim 3, wherein during the read operation, the control circuit controls the gates of the second memory transistors to be at a third one of the stored verify voltages.

5. The semiconductor storage device according to claim 4, wherein the third one of the stored verify voltages is equal to the first one or the second one of the stored verify voltages.

6. The semiconductor storage device according to claim 4, wherein during the read operation, the control circuit controls the gates of the second memory transistors to be at a fourth one of the stored verify voltages different from the third one.

7. The semiconductor storage device according to claim 1, wherein the control circuit is configured to alternately repeat the program operation and the verify operation after the read operation during the first write sequence.

8. The semiconductor storage device according to claim 1, wherein the control circuit is configured to perform an erase operation and then a second write sequence with respect to the first memory transistors of the memory strings, and perform the first write sequence after the second write sequence.

9. The semiconductor storage device according to claim 8, wherein during the second write sequence, no read operation with respect to the second memory transistors of the memory strings is performed.

10. The semiconductor storage device according to claim 8, wherein the control circuit is configured to perform a third write sequence with respect to the second memory transistors of the memory strings after the second write sequence and before the first write sequence.

11. The semiconductor storage device according to claim 10, wherein during the third write sequence, no read operation with respect to the second memory transistors of the memory strings is performed.

12. A semiconductor storage device, comprising:
   a memory string including first and second memory transistors adjacent to each other;
   a first wiring connected to a gate of the first memory transistor;
   a second wiring connected to a gate of the second memory transistor; and a control circuit configured to perform, during a first write sequence, a read operation with respect to the second memory transistor, a program operation with respect to the first memory transistor, and a verify operation with respect to the first memory transistor, in this order, wherein during the read operation, the control circuit controls the first wiring to be at a read pass voltage and the second wiring to be at a read voltage less than the read pass voltage, during the program operation, the control circuit controls the first wiring to be at a program voltage greater than the read pass voltage and the second wiring to be at a write pass voltage less than the program voltage and greater than the read voltage, and during the verify operation, the control circuit controls the first wiring to be at a verify voltage less than the read pass voltage and the second wiring to be at the read pass voltage.

13. The semiconductor storage device according to claim 12, wherein the write pass voltage is greater than the read pass voltage.

14. The semiconductor storage device according to claim 12, wherein the semiconductor storage device stores values of a plurality of verify voltages, including the verify voltage, and the read voltage is equal to one of the verify voltages.

15. The semiconductor storage device according to claim 12, wherein during a first time period in the verify operation, the control circuit controls the first wiring to be at a first verify voltage less than the read pass voltage and the second wiring to be at the read pass voltage, and during a second time period in the verify operation, the control circuit controls the first wiring to be at a second verify voltage less than the read pass voltage and the second wiring to be at the read pass voltage, the second verify voltage being different from the first verify voltage.

16. The semiconductor storage device according to claim 12, wherein the control circuit is configured to alternately repeat the program operation and the verify operation after the read operation during the first write sequence.

17. The semiconductor storage device according to claim 12, wherein the control circuit is configured to perform an erase operation and then a second write sequence with respect to the first memory transistor, and perform the first write sequence after the second write sequence.

18. The semiconductor storage device according to claim 17, wherein during the second write sequence, no read operation with respect to the second memory transistor is performed.

19. The semiconductor storage device according to claim 17, wherein the control circuit is configured to perform a third write sequence with respect to the second memory transistor after the second write sequence and before the first write sequence.

20. The semiconductor storage device according to claim 19, wherein during the third write sequence, no read operation with respect to the second memory transistor is performed.

* * * * *